(12) United States Patent
Hayashi et al.

(10) Patent No.: US 11,223,003 B2
(45) Date of Patent: Jan. 11, 2022

(54) THERMOELECTRIC CONVERSION ELEMENT AND METHOD OF MANUFACTURING THERMOELECTRIC CONVERSION ELEMENT

(71) Applicant: Murata Manufacturing Co., Ltd., Nagaokakyo (JP)

(72) Inventors: Sachiko Hayashi, Nagaokakyo (JP); Osamu Chikagawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/815,196

(22) Filed: Mar. 11, 2020

(65) Prior Publication Data

US 2020/0212281 A1    Jul. 2, 2020

Related U.S. Application Data

(63) Continuation of application No. PCT/JP2018/029737, filed on Aug. 8, 2018.

(30) Foreign Application Priority Data

Sep. 29, 2017    (JP) .............................. JP2017-191681

(51) Int. Cl.
*H01L 35/28*    (2006.01)
*H01L 35/00*    (2006.01)
(Continued)

(52) U.S. Cl.
CPC .............. *H01L 35/10* (2013.01); *H01L 35/22* (2013.01); *H01L 35/28* (2013.01); *H01L 35/34* (2013.01)

(58) Field of Classification Search
CPC ......... H01L 35/10; H01L 35/22; H01L 35/28; H01L 35/34; H01L 35/32
See application file for complete search history.

(56) References Cited

U.S. PATENT DOCUMENTS

| | | | |
|---|---|---|---|
| 2014/0246066 A1* | 9/2014 | Chen | H01L 35/34 |
| | | | 136/212 |
| 2018/0083175 A1 | 3/2018 | Hayashi et al. | |
| 2018/0366630 A1 | 12/2018 | Hayashi | |

FOREIGN PATENT DOCUMENTS

| | | | |
|---|---|---|---|
| JP | H11121815 A | 4/1999 | |
| JP | 2001304955 A | 10/2001 | |

(Continued)

OTHER PUBLICATIONS

International Search Report Issued for PCT/JP2018/029737, dated Oct. 23, 2018.

(Continued)

*Primary Examiner* — Angelo Trivisonno
(74) *Attorney, Agent, or Firm* — Arent Fox LLP

(57) ABSTRACT

A thermoelectric conversion element that includes a laminated body having a plurality of first thermoelectric conversion portions, a plurality of second thermoelectric conversion portions, and an insulator layer. The first thermoelectric conversion portions and the second thermoelectric conversion portions are alternately arranged in a Y-axis direction and bonded to each other in first regions, and the insulator layer is interposed between the first thermoelectric conversion portions and the second thermoelectric conversion portions in second regions. The insulator layer surrounds a periphery of each of the second thermoelectric conversion portions. A ratio (W2/W1) of a thickness (W2) of the first thermoelectric conversion portion to a thickness (W1) of the second thermoelectric conversion portion in the Y-axis direction is greater than 4 and 11 or less.

13 Claims, 11 Drawing Sheets

(51) Int. Cl.
*H01L 37/00* (2006.01)
*H01L 35/10* (2006.01)
*H01L 35/22* (2006.01)
*H01L 35/34* (2006.01)

(56) References Cited

FOREIGN PATENT DOCUMENTS

| JP | 2006203009 A | 8/2006 |
| WO | 2016199484 A1 | 12/2016 |
| WO | 2017163507 A1 | 9/2017 |

OTHER PUBLICATIONS

Written Opinion of the International Searching Authority issued for PCT/JP2018/029737, dated Oct. 23, 2018.

* cited by examiner

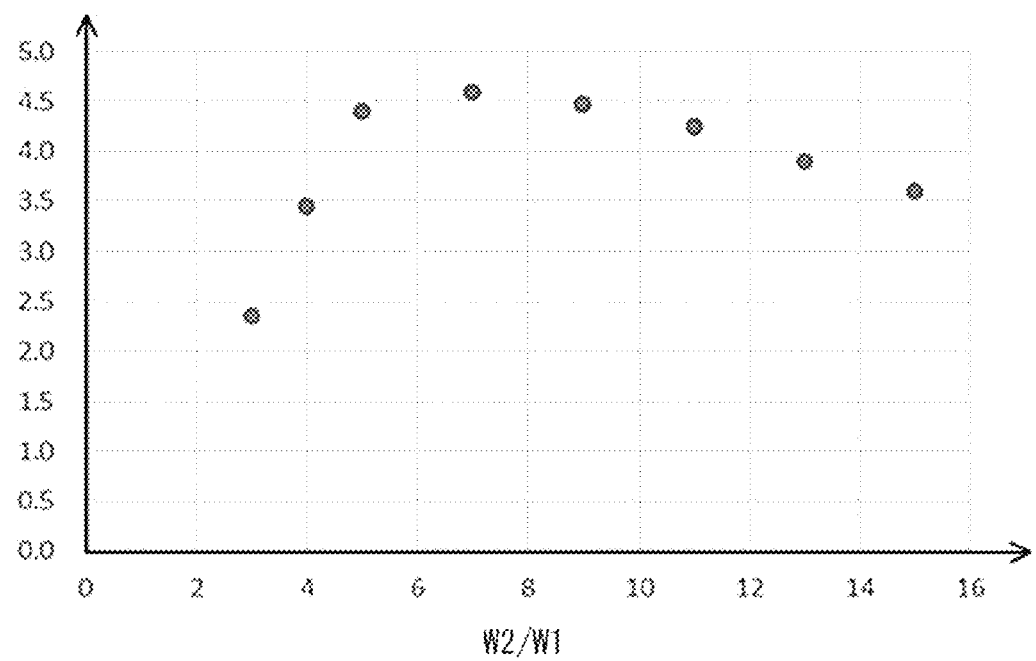

THERMOELECTRIC CONVERSION ELEMENT AND METHOD OF MANUFACTURING THERMOELECTRIC CONVERSION ELEMENT

CROSS REFERENCE TO RELATED APPLICATIONS

The present application is a continuation of International application No. PCT/JP2018/029737, filed Aug. 8, 2018, which claims priority to Japanese Patent Application No. 2017-191681, filed Sep. 29, 2017, the entire contents of each of which are incorporated herein by reference.

FIELD OF THE INVENTION

The present invention relates to a thermoelectric conversion element and a method of manufacturing the thermoelectric conversion element.

BACKGROUND OF THE INVENTION

There has been proposed a thermoelectric conversion element in which a plurality of N-type thermoelectric conversion portions and a plurality of P-type thermoelectric conversion portions are alternately arranged (for example, see Patent Document 1). This thermoelectric conversion element has a structure in which a part of each thermoelectric conversion portion is exposed on an outer surface of the thermoelectric conversion element. In addition, examples of this type of thermoelectric conversion element include a thermoelectric conversion element in which an N-type thermoelectric conversion portion is formed using an N-type oxide semiconductor material containing an oxide, and a P-type thermoelectric conversion portion is formed using a P-type semiconductor material containing metal. Incidentally, when such a thermoelectric conversion element is used in an atmosphere in which a corrosive gas such as hydrogen sulfide is dispersed, a part of the P-type thermoelectric conversion portion exposed to the outer surface of the thermoelectric conversion element is exposed to the corrosive gas. Then, the metal contained in the P-type thermoelectric conversion portion reacts with the corrosive gas, and impurities containing a corrosive gas component are formed in the part of the P-type thermoelectric conversion portion exposed on the outer surface of the thermoelectric conversion element. In this case, carrier movement in the P-type thermoelectric conversion portion is hindered, and an output voltage of the thermoelectric conversion element is lowered.

In response thereto, with regard to the above-described thermoelectric conversion element, there is a considered configuration in which the outer surface of the P-type thermoelectric conversion portion is covered with an insulator layer resistant to the corrosive gas. In this case, contact of the P-type thermoelectric conversion portion with the corrosive gas is prevented, so that the decrease in the output voltage of the thermoelectric conversion element described above is suppressed.

Patent Document 1: Japanese Patent Application Laid-Open No. 11-121815

SUMMARY OF THE INVENTION

Incidentally, a thermal expansion coefficient may be greatly different between the N-type thermoelectric conversion portion formed using the N-type oxide semiconductor material containing the oxide and the P-type thermoelectric conversion portion formed using the P-type semiconductor material containing metal in many cases. Further, in a case where the P-type thermoelectric conversion portion is covered with the insulating layer as described above, stresses applied to the P-type and N-type thermoelectric conversion portions increase when ambient temperatures of the P-type and N-type thermoelectric conversion portions greatly fluctuate. Therefore, for example, there is concern that the P-type and N-type thermoelectric conversion portions may be easily cracked after a firing process included in a manufacturing process of the thermoelectric conversion element. In addition, when a difference between a resistance value of the P-type thermoelectric conversion portion and a resistance value of the N-type thermoelectric conversion portion increases, power generation efficiency of the thermoelectric conversion element decreases accordingly.

The invention has been made in view of the above-described reasons, and an object thereof is to provide a thermoelectric conversion element having reduced generation of cracks in a thermoelectric conversion portion in a manufacturing process and having high power generation efficiency, and a method of manufacturing the thermoelectric conversion element.

A thermoelectric conversion element according to the invention includes a laminated body having a plurality of first thermoelectric conversion portions; a plurality of second thermoelectric conversion portions alternately arranged in an arrangement direction with the plurality of first thermoelectric conversion portions such that the plurality of first thermoelectric conversion portions and the plurality of second thermoelectric conversion portions are directly bonded to each other in first regions of bonded surfaces between the plurality of first thermoelectric conversion portions and the plurality of second thermoelectric conversion portions; and an insulator layer interposed between the plurality of first thermoelectric conversion portions and the plurality of second thermoelectric conversion portions in second regions of the bonded surfaces so as to surround a periphery of each of the plurality of second thermoelectric conversion portions. The laminated body has a first main surface and a second main surface located at opposed ends thereof in the arrangement direction and end surfaces located at opposed ends in a direction perpendicular to the arrangement direction, and a ratio of a first thickness of each of the plurality of first thermoelectric conversion portions to a second thickness of each of the plurality of second thermoelectric conversion portions in the arrangement direction is greater than 4 and 11 or less.

In addition, the thermoelectric conversion element according to the invention may further include a first electrode on the first main surface of the laminated body; and a second electrode on the second main surface of the laminated body. Each of the first electrode and the second electrode may include a NiCr layer in which at least a part thereof is in contact with the first main surface or the second main surface of the laminated body.

In addition, in the thermoelectric conversion element according to the invention, the first and second electrodes may be disposed inside a projection area of the second thermoelectric conversion portions in the arrangement direction on each of the first main surface and the second main surface.

In addition, in the thermoelectric conversion element according to the invention, a smallest thickness of a part of the NiCr layer in the arrangement direction may be 1 μm or less.

In addition, in the thermoelectric conversion element according to the invention, the first and second electrodes may include a metal film.

In addition, in the thermoelectric conversion element according to the invention, each of the first thermoelectric conversion portions may comprise an oxide semiconductor, each of the second thermoelectric conversion portions may comprise a semiconductor containing a metal, and the insulator layer may comprise an oxide insulator.

In addition, in the thermoelectric conversion element according to the invention, the oxide semiconductor may be an N-type semiconductor containing a complex oxide, a semiconductor containing the metal may be a P-type semiconductor containing Ni, Mo, and the composite oxide, the oxide insulator may contain $Y_2O_3$—$ZrO_2$, and the composite oxide may contain Sr, La, and Ti.

In addition, in the thermoelectric conversion element according to the invention, the oxide insulator may further contain Mn.

A method of manufacturing a thermoelectric conversion element from another viewpoint includes the steps of forming a first insulator paste layer provided with a first slit on an oxide thermoelectric conversion material sheet, forming a metal thermoelectric conversion material paste layer covering the first slit on the first insulator paste layer, forming a second insulator paste layer around a periphery of the metal thermoelectric conversion material paste layer on the first insulator paste layer, covering the metal thermoelectric conversion material paste layer and the second insulator paste layer with a third insulator paste layer provided with a second slit, producing a laminated body including the oxide thermoelectric conversion material sheet, the metal thermoelectric conversion material paste layer, the first insulator paste layer, the second insulator paste layer, and the third insulator paste layer, and firing the laminated body such that thicknesses of the oxide thermoelectric conversion material sheet and the metal thermoelectric conversion material paste layer are set such that a ratio of a first thickness of the oxide thermoelectric conversion material sheet to a second thickness of the metal thermoelectric conversion material paste layer is greater than 4 and 11 or less after the firing of the laminated body.

In addition, the method of manufacturing the thermoelectric conversion element according to the invention may further include forming an electrode after the firing of the laminated body.

In addition, in the method of manufacturing the thermoelectric conversion element according to the invention, the electrode may be formed using a sputtering method.

According to the invention, the ratio of the thickness of the first thermoelectric conversion portion to the thickness of the second thermoelectric conversion portion in the arrangement direction of the first thermoelectric conversion portions and the second thermoelectric conversion portions is greater than 4. In this way, for example, when the thermal expansion coefficient of the second thermoelectric conversion portions is larger than the thermal expansion coefficient of the first thermoelectric conversion portions, the stress applied to the first thermoelectric conversion portions and the second thermoelectric conversion portions immediately after the firing process included in the process of manufacturing the thermoelectric conversion element is alleviated. Therefore, generation of cracks in the first thermoelectric conversion portions and the second thermoelectric conversion portions immediately after the firing process is reduced. In addition, according to the invention, the ratio of the thickness of the first thermoelectric conversion portion to the thickness of the second thermoelectric conversion portion in the arrangement direction of the first thermoelectric conversion portions and the second thermoelectric conversion portions is greater than 4 and 11 or less. In this way, for example, when the first thermoelectric conversion portions include a composite oxide containing Sr, La, and Ti, and the second thermoelectric conversion portions includes Ni, Mo, and the composite oxide, the resistance value of the first thermoelectric conversion portions can be brought close to the resistance value of the second thermoelectric conversion portions, and thus the power generation efficiency of the thermoelectric conversion element is improved accordingly.

BRIEF EXPLANATION OF THE DRAWINGS

FIGS. 5(A) to 5(C) illustrate respective processes of a method of manufacturing the thermoelectric conversion element according to an embodiment, in which FIG. 5(A) is a perspective view illustrating a process of forming a first insulator paste layer, FIG. 5(B) is a perspective view illustrating a process of forming a P-type semiconductor material paste layer, and FIG. 5(C) is a perspective view illustrating a process of forming a second insulator paste layer.

FIGS. 6(A) to 6(c) illustrate respective processes of a method of manufacturing the thermoelectric conversion element according to an embodiment, in which FIG. 6(A) is a perspective view illustrating a process of forming a third insulator paste layer, FIG. 6(B) is a perspective view illustrating a process of laminating an N-type oxide semiconductor material sheet, and FIG. 6(C) is a perspective view illustrating a process of producing a laminate sheet.

FIGS. 7(A) to 7(C) illustrate respective processes of the method of manufacturing the thermoelectric conversion element according to the embodiment, in which FIG. 7(A) is a cross-sectional view in a process of forming a ground layer, FIG. 7(B) is a cross-sectional view in a process of forming an intermediate layer, and FIG. 7(C) is a cross-sectional view in a process of forming a contact layer.

FIG. 8 is a diagram illustrating power generation efficiency of thermoelectric conversion elements according to examples and comparative examples.

DETAILED DESCRIPTION OF THE INVENTION

Hereinafter, a thermoelectric conversion element according to an embodiment of the invention will be described in detail with reference to drawings.

Figure 1:
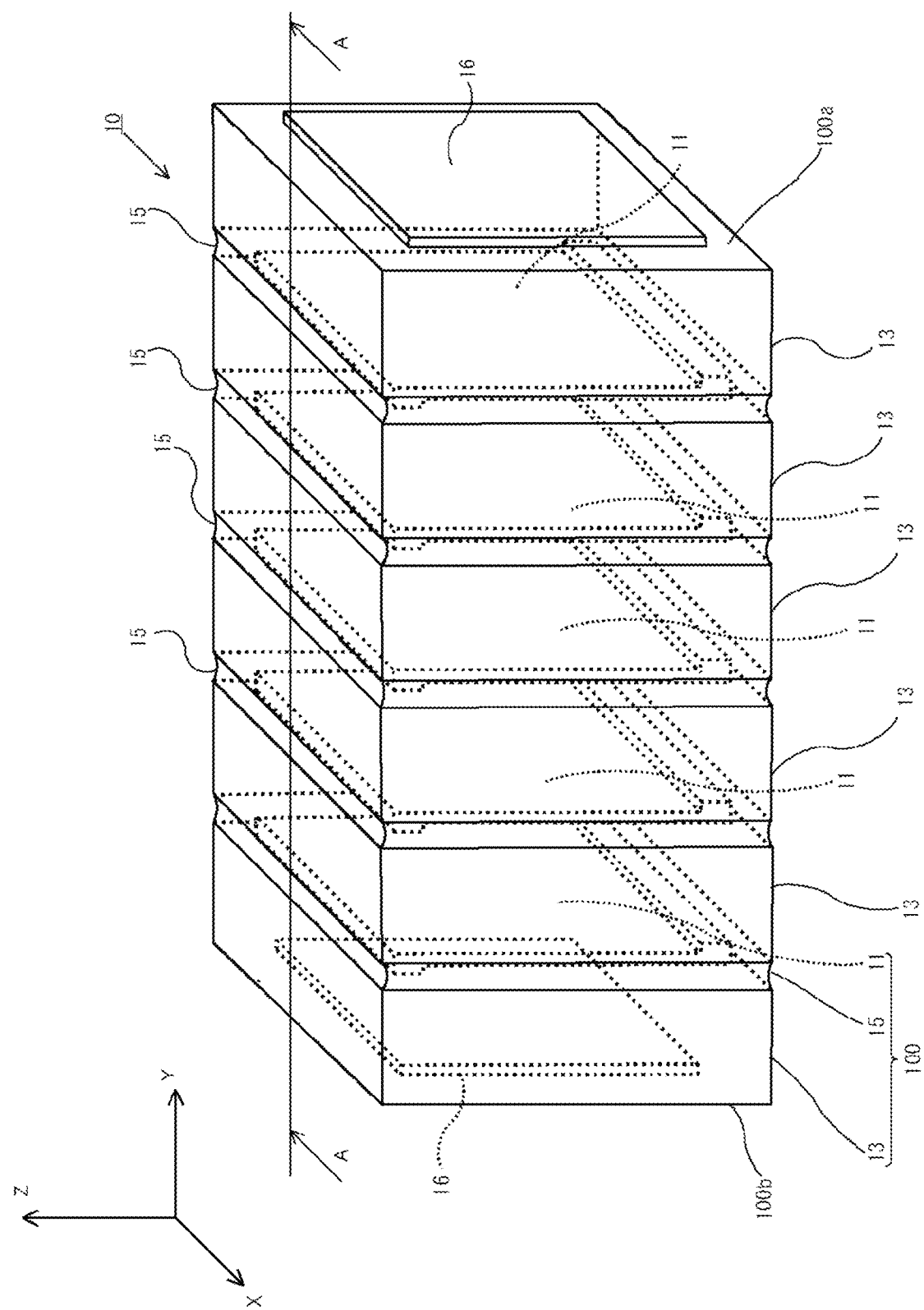
FIG. 1 is a perspective view of a thermoelectric conversion element according to an embodiment.
Figure 2:
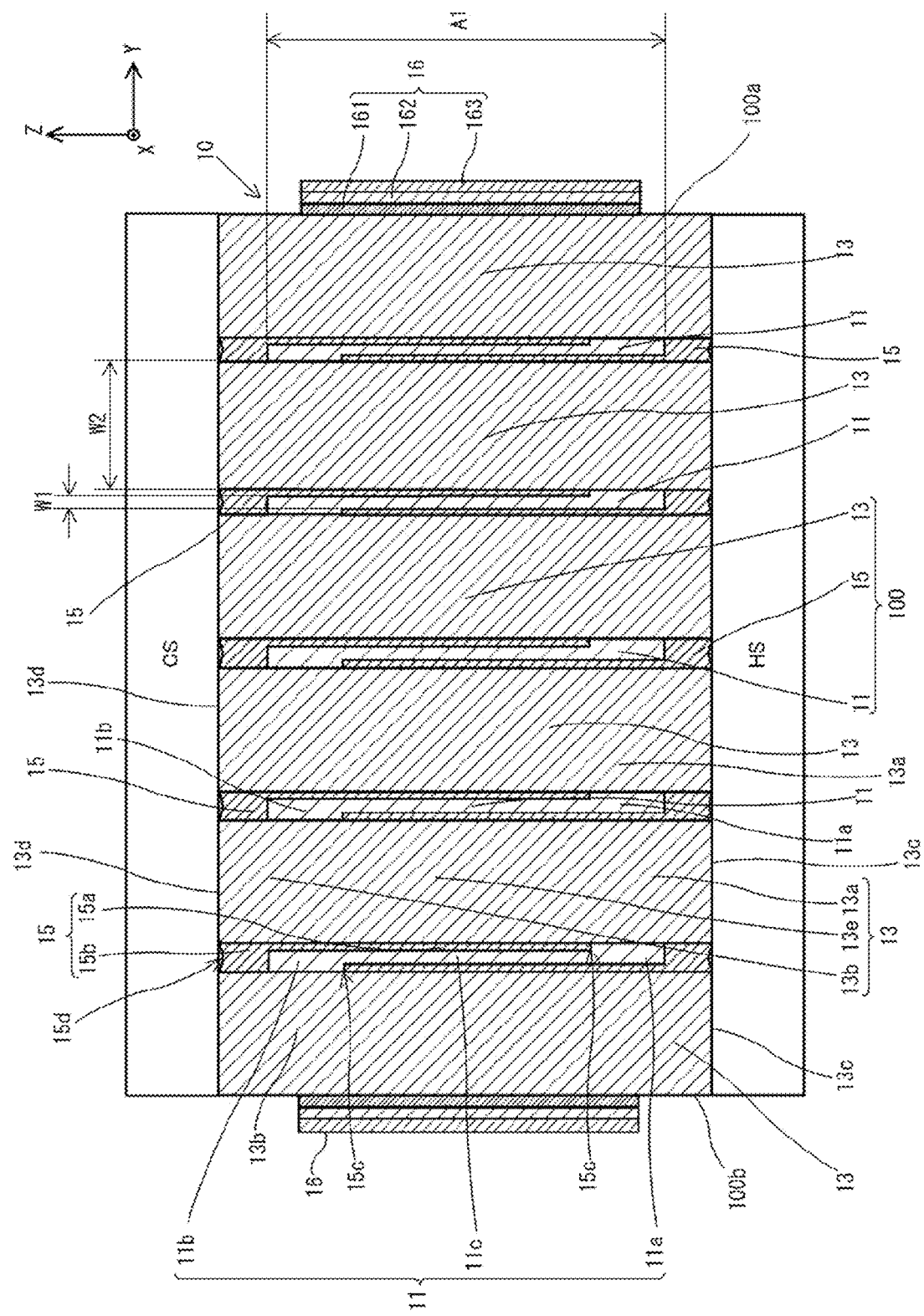
FIG. 2 is a cross-sectional view of the thermoelectric conversion element according to the embodiment, taken along A-A line of FIG. 1.

As illustrated in FIG. 1 and FIG. 2, the thermoelectric conversion element 10 according to the present embodiment includes a laminated body including a plurality of first thermoelectric conversion portions 13, a plurality of second thermoelectric conversion portions 11, a plurality of insulator layers 15, and an electrode 16. Note that in the description of the present embodiment, it is presumed that a +Z direction is set to an upward direction and a −Z direction is set to a downward direction in FIG. 1. As illustrated in FIG. 2, the thermoelectric conversion element 10 generates power in a state of being thermally coupled to each of a heat source HS located on a lower side (−Z direction side) and a cold source CS located on an upper side (+Z direction side of FIG. 1) and lower in temperature than the heat source. Note that a description will be given on the assumption that the heat source HS and the cold source CS have flat contact surfaces with respect to the thermoelectric conversion element 10. For example, a heat sink having a metal flat plate thermally coupled to a heat radiating fin or a refrigerant pipe is employed as the cold source CS. For example, a metal flat plate thermally coupled to an exhaust heat pipe installed in a factory etc. is employed as the heat source HS. Further, depending on the required power, a plurality of thermoelectric conversion elements 10 may be used in a state of being connected in series or in parallel.

The plurality of first thermoelectric conversion portions 13 and the plurality of second thermoelectric conversion portions 11 are alternately arranged and bonded with the insulator layers 15 interposed therebetween in one direction. Hereinafter, a description will be given on the assumption that an arrangement direction of the first thermoelectric conversion portions 13 and the second thermoelectric conversion portions 11 coincides with a Y-axis direction of FIG. 1. Here, the first thermoelectric conversion portions 13 and the second thermoelectric conversion portions 11 are directly bonded in first regions of bonded surfaces between the first thermoelectric conversion portions 13 and the second thermoelectric conversion portions 11, and the first thermoelectric conversion portions 13 and the second thermoelectric conversion portions 11 are bonded with the insulator layers 15 interposed therebetween in second regions of the bonded surfaces described above. That is, a lower portion 11a of one of the second thermoelectric conversion portions 11 is electrically connected to a lower end portion 13a of a first thermoelectric conversion portion 13 adjacent thereto in a +Y direction. In addition, an upper portion 11b of one of the second thermoelectric conversion portions 11 is electrically connected to an upper end portion 13b of a first thermoelectric conversion portion 13 adjacent thereto in a −Y direction. A laminated body 100 includes the plurality of first thermoelectric conversion portions 13, the plurality of second thermoelectric conversion portions 11, and the insulator layers 15. The laminated body 100 has a first main surface 100a and a second main surface 100b located at opposed ends in the Y-axis direction, and end surfaces located at opposed ends in a Z-axis direction perpendicular to the Y-axis direction. The first thermoelectric conversion portion 13 has end surfaces 13c and 13d orthogonal to the Z-axis direction at opposed ends in the Z-axis direction. The end surfaces 13c and 13d of each of the plurality of first thermoelectric conversion portions 13 are formed so that the end surfaces are present in the same plane. Further, a ratio W2/W1 of a thickness W2 of the first thermoelectric conversion portion 13 to a thickness W1 of the second thermoelectric conversion portion 11 in the Y-axis direction is set to be greater than 4 and 11 or less. Here, the thickness W2 of the first thermoelectric conversion portion 13 corresponds to an average value of Y-axis direction thicknesses of the lower end portion 13a, a central portion 13e, and the upper end portion 13b of the first thermoelectric conversion portion 13, respectively. Further, the thickness W1 of the second thermoelectric conversion portion 11 is a thickness of the second thermoelectric conversion portion 11 interposed by a second insulator portion 15a of the insulator layer 15 described later. The thickness W1 corresponds to an average value of Y-axis direction thicknesses of the lower portion 11a, a central portion 11c, and the upper portion 11b of the second thermoelectric conversion portion 11, respectively.

The first thermoelectric conversion portion 13 is an oxide semiconductor. The oxide semiconductor includes, for example, a composite oxide represented by a composition formula: $ATiO_3$ having a perovskite structure. Such a composition is defined as an N-type semiconductor. Here, A in the composition formula: $ATiO_3$ may be obtained by substituting Sr with La in a range of $0 \leq x < 0.2$ in $La_{1-x}Sr_x$. For example, $(Sr_{0.97}La_{0.03})TiO_3$ may be obtained. An N-type semiconductor containing this composite oxide is chemically stable against the corrosive gas such as hydrogen sulfide and an oxidizing gas.

The second thermoelectric conversion portion 11 includes, for example, a NiMo alloy and a composite oxide represented by a composition formula: $ATiO_3$ having a perovskite structure. Such a composition is defined as a P-type semiconductor. In other words, the second thermoelectric conversion portion 11 is defined as a semiconductor containing a metal. Here, A in the composition formula: $ATiO_3$ may be obtained by substituting Sr with La in a range of $0 \leq x < 0.2$ in $La_{1-x}Sr_x$. For example, $(Sr_{0.97}La_{0.03})TiO_3$ may be obtained.

The insulator layer 15 includes a first insulator portion 15b and a second insulator portion 15a. The first insulator portion 15b and the second insulator portion 15a are integrally molded. The second insulator portion 15a is interposed between the first thermoelectric conversion portion 13 and the second thermoelectric conversion portion 11 adjacent to each other in the Y-axis direction. The first thermoelectric conversion portion 13 and the second thermoelectric conversion portion 11 are bonded to each other in a bonding portion 15c where the second insulator portion 15a is not formed. The first insulator portion 15b covers end portions of the second thermoelectric conversion portion 11 in the ±X direction and the ±Z direction. The first insulator portion 15b is disposed to surround a periphery of the second thermoelectric conversion portion 11. Further, the first insulator portion 15b has a concave portion 15d recessed toward a central portion side of the second thermoelectric conversion portion 11 in the Z-axis direction from both the end surfaces 13c and 13d of the first thermoelectric conversion portion 13 in the Z-axis direction. That is, the concave portion 15d recessed toward a center of the laminated body in the X-axis direction and the Z-axis direction from the end surface 13d in the X-axis direction and the Z-axis direction in the first thermoelectric conversion portion 13 is formed on the end surface of the insulator layer 15. The insulator layer 15 is formed using an oxide insulator material having electrical insulation. For example, $Y_2O_3$—$ZrO_2$, that is, $ZrO_2$ (yttria stabilized zirconia) to which $Y_2O_3$ is added as a stabilizer is employed as this oxide insulator material. This oxide insulator material containing $Y_2O_3$—$ZrO_2$ is chemically stable against the corrosive gas such as hydrogen sulfide and an oxidizing gas.

Figure 3:
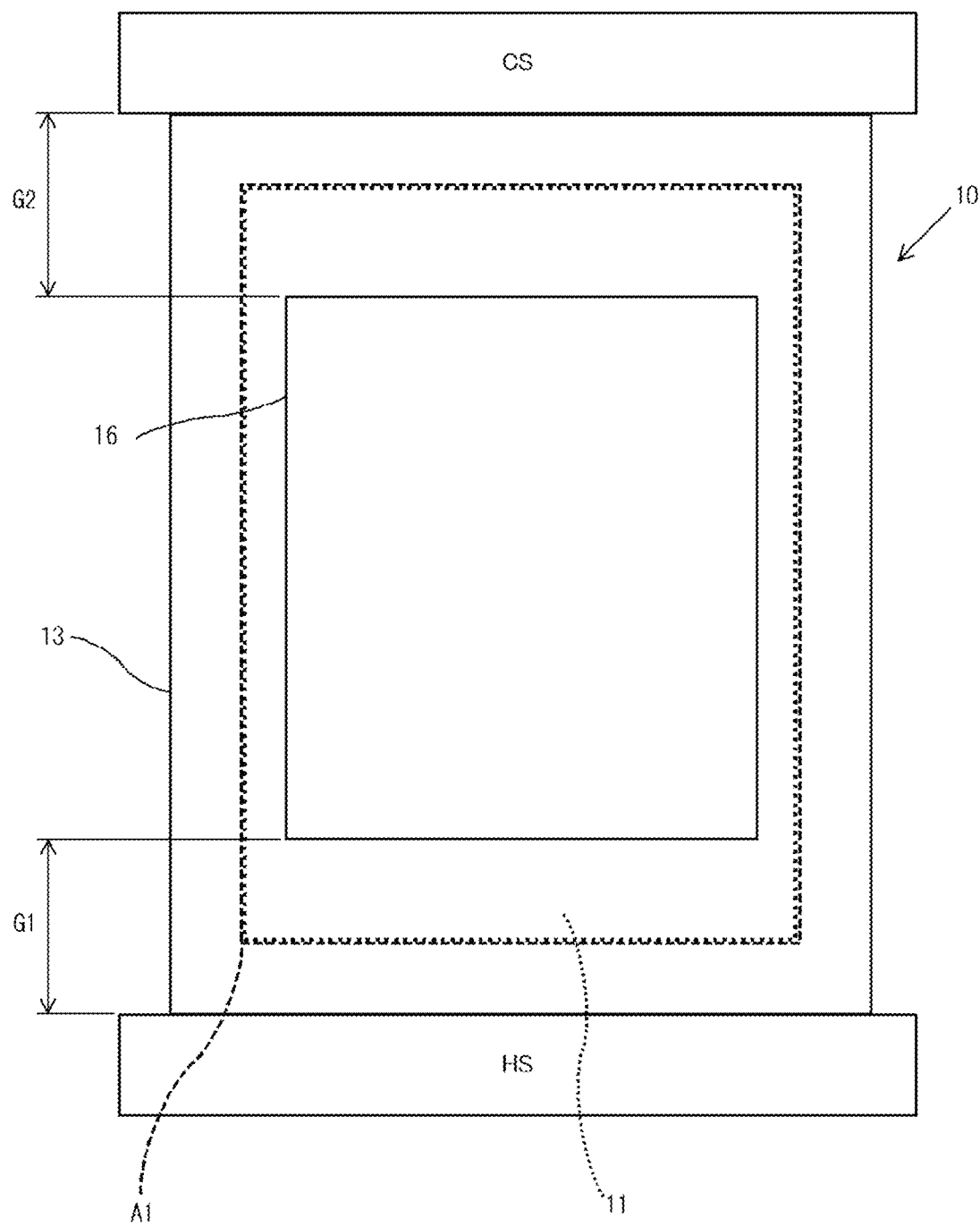
FIG. 3 is a side view of the thermoelectric conversion element according to the embodiment as viewed from a +Y direction.

As illustrated in FIG. 2, the electrode 16 is provided on each of a first thermoelectric conversion portion 13 located at an end in the +Y direction and a first thermoelectric conversion portion 13 located at an end in the −Y direction among the plurality of first thermoelectric conversion portions 13. In other words, the electrode 16 is provided on each of both the end surfaces (the first main surface 100a and the second main surface 100b) of the laminated body 100 in the Y-axis direction. The electrode 16 has a ground layer 161 formed on the first thermoelectric conversion portion 13, that is, the first main surface 100a or the second main surface 100b of the laminated body 100, an intermediate layer 162 laminated on the ground layer 161, and a contact layer 163 formed on the intermediate layer 162. A part of the ground layer 161, that is, the electrode 16 in contact with the first main surface 100a or the second main surface 100b of the laminated body 100 corresponds to a NiCr layer formed using NiCr. The intermediate layer 162 is formed using NiCu, and the contact layer 163 is formed using Ag. In addition, all the ground layer 161, the intermediate layer 162, and the contact layer 163 are metal films formed using a sputtering method. Further, as illustrated in FIG. 3, the electrode 16 is disposed inside a projection area A1 of the second thermoelectric conversion portions 11 in the Y-axis direction on each of the first main surface 100a and the second main surface 100b of the laminated body 100. In this way, gaps G1 and G2 are formed between the electrode 16 and each of the heat source HS and the cold source CS.

Figure 4:
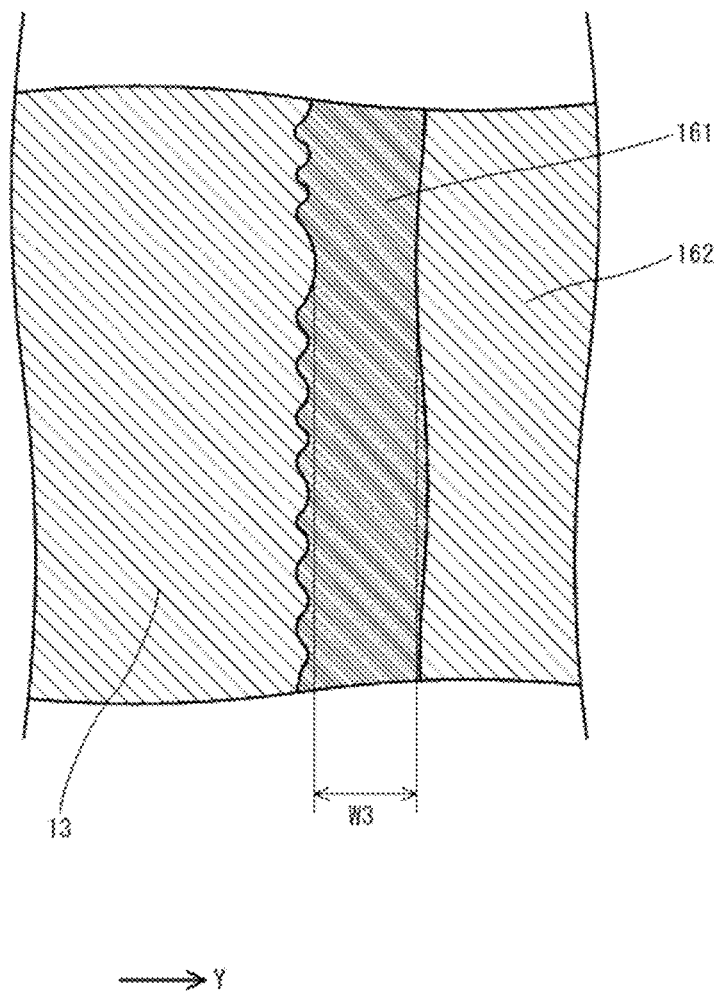
FIG. 4 is a cross-sectional view of an interface between a first thermoelectric conversion portion and an electrode of the thermoelectric conversion element according to the embodiment.

In addition, as illustrated in FIG. 4, a thickness W3 of a part of the ground layer 161 having a smallest thickness in the Y-axis direction is 1 μm or less. A thickness of each of the intermediate layer 162 and the contact layer 163 is set to 1 μm or less. As described above, since the ground layer 161 is covered with the intermediate layer 162 and the contact layer 163, deterioration of the ground layer 161 due to oxidation is suppressed. For example, a lead wire (not illustrated) for extracting power generated by the thermoelectric conversion element 10 is bonded to the electrode 16. The lead wire connected to the electrode 16 is connected to, for example, a power management circuit or a wireless communication circuit. In this case, the thermoelectric conversion element 10 functions as a driving power source for the power management circuit or the wireless communication circuit.

As illustrated in FIG. 2, it is presumed that the heat source HS is in contact with the end surface of the thermoelectric conversion element 10 in the −Z direction, and the cold source CS is in contact with the end surface of the thermoelectric conversion element 10 in the +Z direction. In this case, due to the Seebeck effect, electrons move in the +Z direction in the first thermoelectric conversion portion 13 to generate a current flowing in the −Z direction, and holes move in the +Z direction in the second thermoelectric conversion portion 11 to generate a current flowing in the +Z direction. As a result, a current flowing in the +Y direction is generated in the thermoelectric conversion element 10.

Next, a description will be given of a method of manufacturing the thermoelectric conversion element 10 according to the present embodiment with reference to FIGS. 5(A)-5(C), FIGS. 6(A)-6(C), and FIGS. 7(A)-7(C). In this manufacturing method, first, an N-type oxide semiconductor material sheet that is an oxide thermoelectric conversion material sheet corresponding to a base of the first thermoelectric conversion portion 13, a P-type semiconductor material paste corresponding to a base of the second thermoelectric conversion portion 11, and insulator paste corresponding to a base of the insulator layer 15 are produced.

In producing the N-type oxide semiconductor material sheet, first, $SrCO_3$, $La_2O_3$, and $TiO_2$ are weighed so that the molar ratio of Sr, La, and Ti is 0.97:0.03:1. Subsequently, pure water is added to the weighed $La_2O_3$, $SrCO_3$, and $TiO_2$ powder materials, and then the materials are pulverized and mixed using a ball mill to produce slurry containing $La_2O_3$, $SrCO_3$, and $TiO_2$. Then, after drying the produced slurry, the slurry is calcined in the air atmosphere. In this way, a powder material of $(Sr_{0.97}La_{0.03})TiO_3$ is produced. Note that a particle size of the powder material is not particularly limited. However, the particle size is preferably determined so that $La_2O_3$, $SrCO_3$, and $TiO_2$ are uniformly mixed. Moreover, a method of calcination is not particularly limited. Further, a calcination temperature may be any temperature as long as the temperature is 1,000° C. or higher.

Thereafter, a powder material of $(Sr_{0.97}La_{0.03})TiO_3$, an organic solvent such as toluene, ethanol, etc., and a binder material such as polyvinyl butyral are mixed to produce a mixture containing $(Sr_{0.97}La_{0.03})TiO_3$. Subsequently, the N-type oxide semiconductor material sheet corresponding to the base of the first thermoelectric conversion portion 13 is formed by molding the produced mixture into a sheet shape. In this instance, the sheet thickness is set to a predetermined thickness, for example, more than 40 μm and 150 μm or less after firing.

In producing the P-type semiconductor material paste, the above-mentioned powder material of $(Sr_{0.97}La_{0.03})TiO_3$, a Ni powder material, and a Mo powder material are weighed. Specifically, weighing is performed so that the molar ratio of Ni and Mo is 0.9:0.1, the combined weight ratio of Ni and Mo is 80 wt. %, and the weight ratio of the powder material of $(Sr_{0.97}La_{0.03})TiO_3$ is 20 wt. %. Subsequently, the P-type semiconductor material paste corresponding to the base of the second thermoelectric conversion portion 11 is produced by mixing the powder material of $(Sr_{0.97}La_{0.03})TiO_3$, the Ni powder material, the Mo powder material, and an organic solvent such as varnish using a roll machine etc. Note that particle sizes of the Ni powder material and the Mo powder material are not particularly limited. However, it is preferable that the particle sizes are determined so that the powder material of $(Sr_{0.97}La_{0.03})TiO_3$, the Ni powder material, and the Mo powder material are uniformly mixed.

Thereafter, a powder material of $Y_2O_3$—$ZrO_2$ is weighed. Specifically, an insulating paste is produced by mixing a $ZrO_2$ powder material containing 3 mol % of $Y_2O_3$ and 97 mol % $ZrO_2$ with an organic solvent such as varnish using a roll machine etc.

Figure 5A:
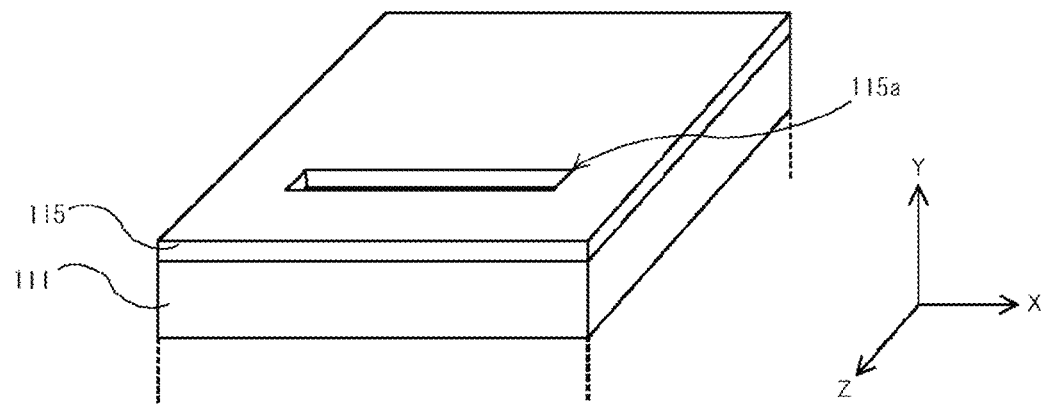

Subsequently, a first insulator paste layer 115 is formed on the N-type oxide semiconductor material sheet 111 using a printing technique as illustrated in FIG. 5(A). A thickness of the first insulator paste layer 115 is about 5 μm. The first insulator paste layer 115 is formed such that a first slit 115a is provided in a part corresponding to a bonding part between the first thermoelectric conversion portion 13 and the second thermoelectric conversion portion 11 in the N-type oxide semiconductor material sheet 111.

Figure 5B:
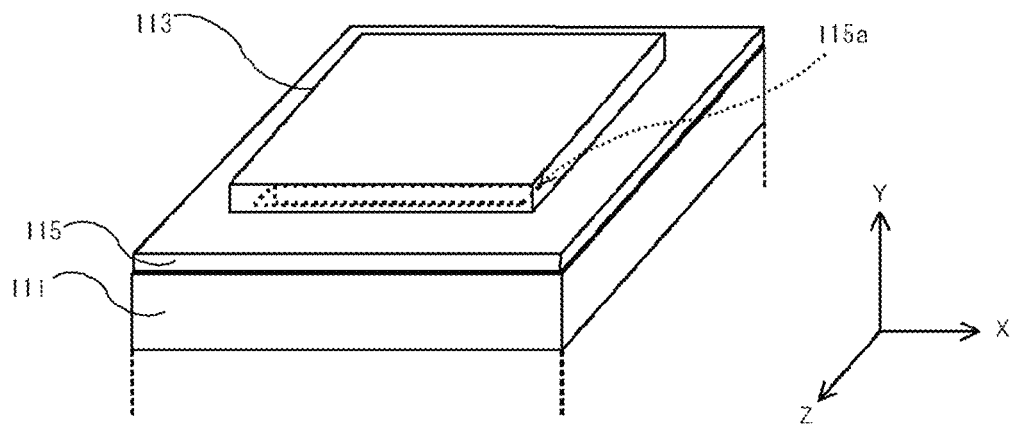

Subsequently, as illustrated in FIG. 5(B), a P-type semiconductor material paste layer 113 corresponding to a metal thermoelectric conversion material paste layer is formed on the first insulator paste layer 115 using a printing technique. A thickness of the P-type semiconductor material paste layer 113 is set to a predetermined thickness, for example, 10 μm after firing. The P-type semiconductor material paste layer 113 is formed to cover the first slit 115a of the first insulator paste layer 115.

Figure 5C:
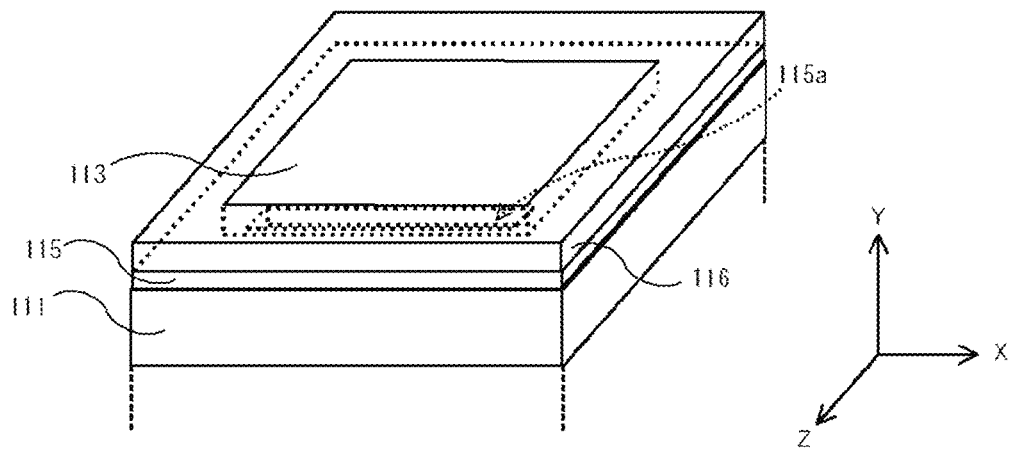

Thereafter, as illustrated in FIG. 5(C), a second insulator paste layer 116 is formed around the P-type semiconductor material paste layer 113 on the first insulator paste layer 115 using a printing technique. The second insulator paste layer 116 has the same thickness as that of the P-type semiconductor material paste layer 113.

Figure 6A:
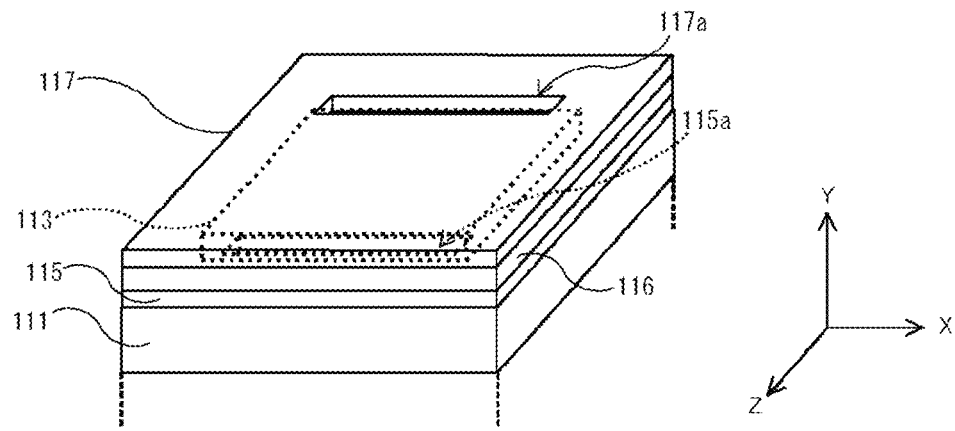

Subsequently, as illustrated in FIG. 6(A), a third insulator paste layer 117 is formed to cover the P-type semiconductor material paste layer 113 and the second insulator paste layer 116 using a printing technique. A thickness of the third insulator paste layer 117 is, for example, 5 μm. A second slit 117a is formed in a part corresponding to a bonding part between the first thermoelectric conversion portion 13 and the second thermoelectric conversion portion 11 located at an end portion of the P-type semiconductor material paste layer 113 in the −Z direction in the third insulator paste layer 117.

Figure 6B:
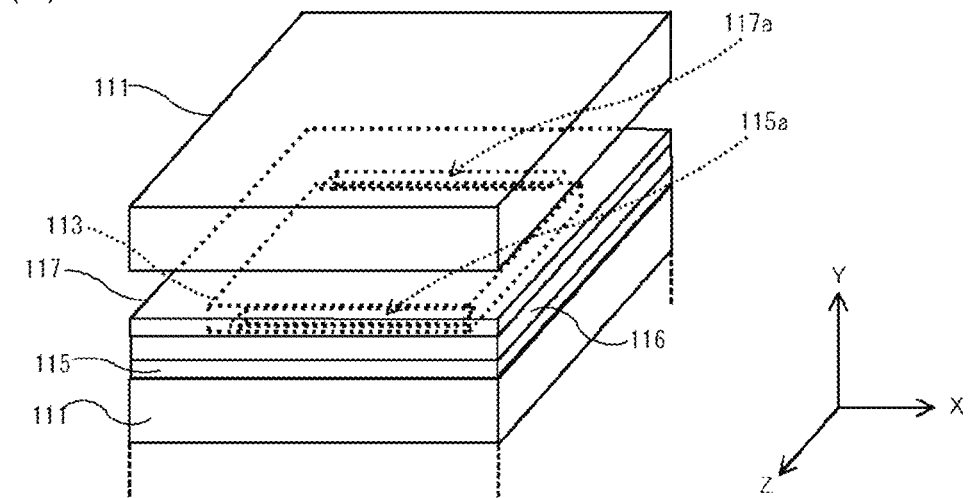

Subsequently, as illustrated in FIG. 6(B), the N-type oxide semiconductor material sheet 111 is laminated on the third insulator paste layer 117. By repeating a series of processes described above with reference to FIG. 5(A) to FIG. 6(B), a plurality of N-type oxide semiconductor material sheets 111, on each of which the P-type semiconductor material paste layer 113 and the insulator paste layers 115, 116, and 117 are formed, is laminated.

Figure 6C:
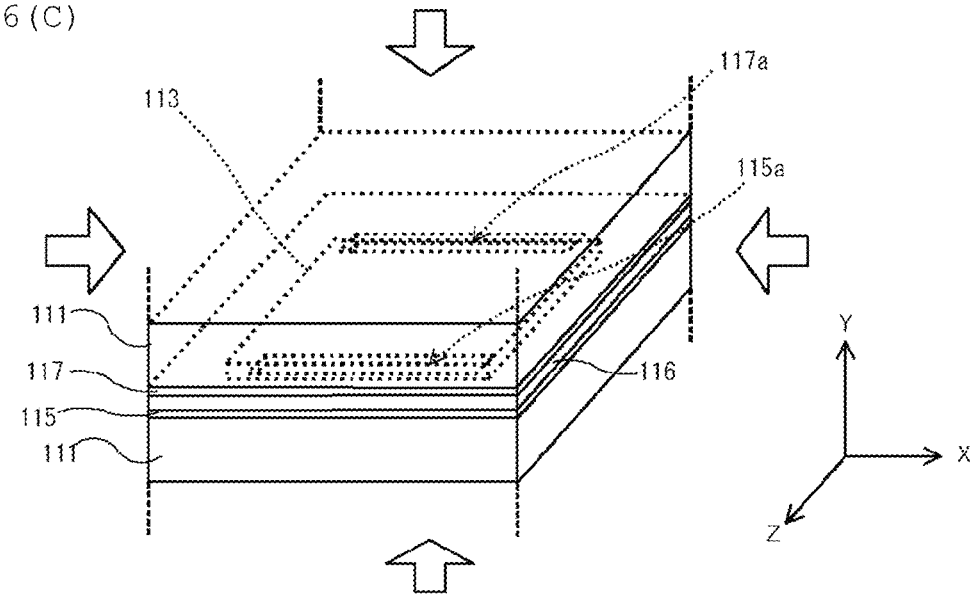

Thereafter, as indicated by arrows of FIG. 6(C), a laminate sheet is produced by performing pressure bonding on the N-type oxide semiconductor material sheets 111, on each of which the P-type semiconductor material paste layer 113 and the insulator paste layers 115, 116, and 117 are formed, using an isotropic isostatic pressing method. This laminate sheet includes the N-type oxide semiconductor material sheet 111, the P-type semiconductor material paste layer 113, the first insulator paste layer 115, the second insulator paste layer 116, and the third insulator paste layer 117. Subsequently, the produced laminate sheet is cut into an individual piece corresponding to one thermoelectric conversion element 10 using a dicing saw. After firing, the individual piece of the laminated body is formed in a predetermined size, for example, a size corresponding to a rectangular parallelepiped shape of about 3.2 mm×5.0 mm×2.6 mm.

Then, after degreasing the individual piece of the laminated body in the atmosphere, the individual piece of the laminated body is fired under the condition of a reducing atmosphere with an oxygen partial pressure of $10^{-10}$ to $10^{-15}$ MPa and a temperature of 1,200° C. to 1,400° C. As a firing method, it is possible to employ a hot press sintering method, a spark plasma sintering (SPS) sintering method, a hot isostatic pressing (HIP) sintering method, etc. In addition, another oxygen partial pressure may be adopted as the oxygen partial pressure as long as Ni and Mo are not oxidized and a thermoelectric characteristic of the first thermoelectric conversion portion 13 is not significantly reduced. Further, another temperature may be adopted as the temperature during firing as long as the relative density of main components of the second thermoelectric conversion portion 11, the first thermoelectric conversion portion 13, and the insulator layer 15 is 80% or more, and the N-type oxide semiconductor material sheet 111, the P-type semiconductor material paste layer 113, and the insulator paste layers 115, 116, and 117 are co-sintered. In this way, the laminated body 100 is formed.

Figure 7A:
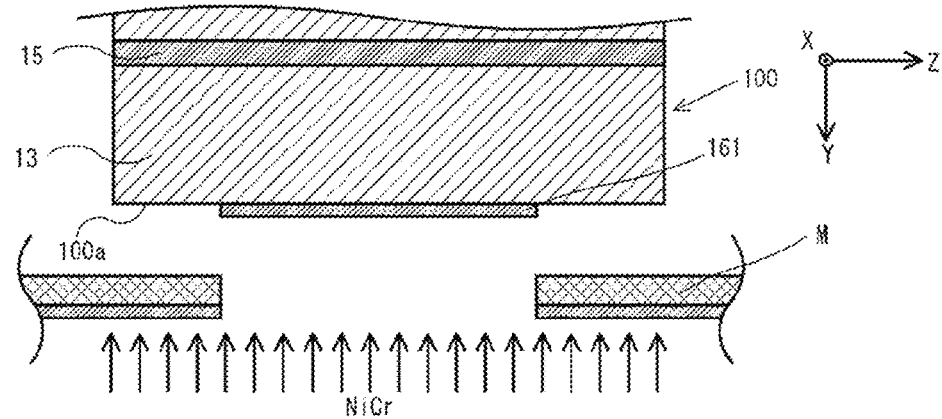
Figure 7B:
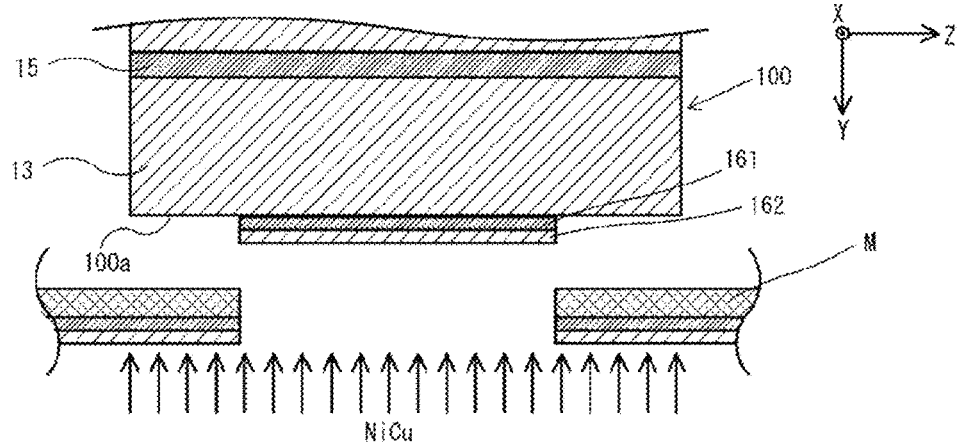
Figure 7C:
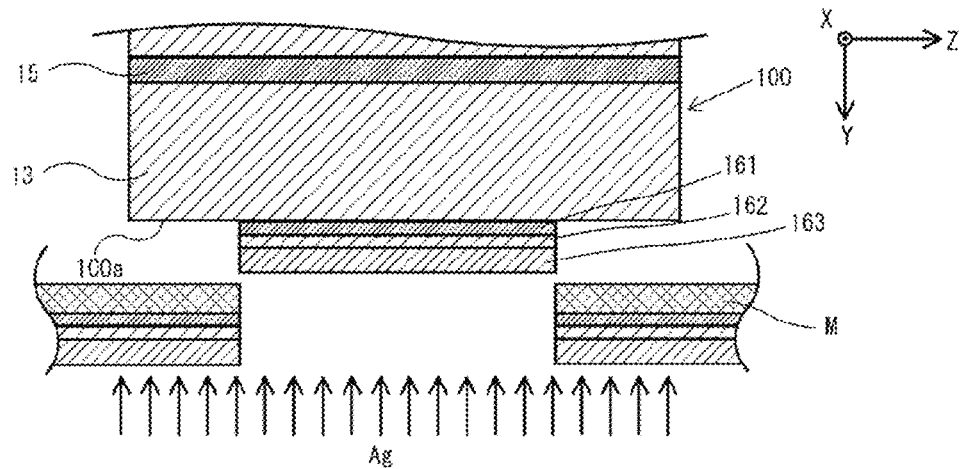

Subsequently, as illustrated in FIG. 7(A), in a state where the first main surface 100a of the laminated body 100 is covered with a metal mask M, a NiCr layer is grown on the first main surface 100a of the laminated body 100 using a sputtering method to form the ground layer 161. Subsequently, as illustrated in FIG. 7(B), while the state where the first main surface 100a of the laminated body 100 is covered with the metal mask M is maintained, a NiCu layer is grown on the first main surface 100a of the laminated body 100 using a sputtering method to form the intermediate layer 162. Thereafter, as illustrated in FIG. 7(C), while the state where the first main surface 100a of the laminated body 100 is covered with the metal mask M is maintained, a Ag layer is grown on the first main surface 100a of the laminated body 100 using a sputtering method to form the contact layer 163. Then, the ground layer 161, the intermediate layer 162, and the contact layer 163 are similarly formed on the second main surface 100b of the laminated body 100. In this way, the electrode 16 is formed on each of the first main surface 100a and the second main surface 100b of the laminated body 100, and the thermoelectric conversion element 10 is completed.

Next, a description will be given of results of evaluating the power generation efficiency, a crack generation rate after the firing process, and the electrical characteristic and adhesion strength of the electrode with respect to the thermoelectric conversion element 10 according to the present embodiment. The power generation efficiency and the crack generation rate after the firing process were evaluated using thermoelectric conversion elements according to Examples 1 to 4 having similar structures to a structure of the thermoelectric conversion element 10 according to the present embodiment and thermoelectric conversion elements according to Comparative Examples 1 to 4 described later. In addition, the electrical characteristic of the electrode and the adhesion strength were evaluated using a thermoelectric conversion elements according to Example 5 having a similar structure to the structure of the thermoelectric conversion element 10 according to the present embodiment and thermoelectric conversion elements according to Comparative Examples 5 to 7 described later.

A thermoelectric conversion element having a length of 5 to 5.5 mm in the X-axis direction, a length of 2.5 to 3.0 mm in the Z-axis direction, 35 layers of the second thermoelectric conversion portions 11, and 36 layers of the first thermoelectric conversion portions 13 was prepared as the thermoelectric conversion elements according to Examples 1 to 4. In addition, the thickness W1 of the second thermoelectric conversion portion 11 was set to 10 μm, the thickness W2 of the first thermoelectric conversion portion 13 was set to 30 μm to 110 μm, and the thickness of the second insulator portion 15a was set to 4 to 7 μm. Meanwhile, the lengths in the X-axis direction and the Z-axis direction, the number of layers of the second thermoelectric conversion portions 11, the number of layers of the first thermoelectric conversion portions 13, the thickness W1 of the second thermoelectric conversion portion 11, and the thickness of the second insulator portion 15a of each of the thermoelectric conversion elements according to Comparative Examples 1 to 4 were set to be the same as those of the thermoelectric conversion elements according to Examples 1 to 4 described above. Further, the thickness W2 of the first thermoelectric conversion portion 13 was set to 30 μm to 40 μm and 130 μm to 150 μm.

A thermoelectric conversion element in which an electrode formed using NiCr is provided on each of the first main surface 100a and the second main surface 100b of the laminated body 100 according to the embodiment was prepared as the thermoelectric conversion element according to Example 5. The lengths in the X-axis direction and the Z-axis direction, the number of layers of the second thermoelectric conversion portions 11, the number of layers of the first thermoelectric conversion portions 13, the thickness W1 of the second thermoelectric conversion portion 11, the thickness W2 of the first thermoelectric conversion portion 13, and the thickness of the second insulator portion 15a of the thermoelectric conversion element according to Example 5 were set to be the same as those of the thermoelectric conversion element according to Example 4 described above. A thermoelectric conversion element in which an electrode formed using Ag, Ni, and NiMo is provided on each of the first main surface 100a and the second main surface 100b of the laminated body 100 according to the embodiment was prepared as the thermoelectric conversion elements according to Comparative Examples 5 to 7. The lengths in the X-axis direction and the Z-axis direction, the number of layers of the second thermoelectric conversion portions 11, the number of layers of the first thermoelectric conversion portions 13, the thickness W1 of the second thermoelectric conversion portion 11, the thickness W2 of the first thermoelectric conversion portion 13, and the thickness of the second insulator portion 15a of each of the thermoelectric conversion elements according to Comparative Examples 5 to 7 were set to be the same as those of the thermoelectric conversion element according to Example 4 described above.

Next, a description will be given of evaluation methods for evaluating the power generation efficiency, the crack generation rate after the firing process, and the electrical characteristic and adhesion strength of the electrode, and evaluation results obtained by implementing the respective evaluation methods.

The power generation efficiency was evaluated by preparing 20 thermoelectric conversion elements according to each of Examples 1 to 4 and Comparative Examples 1 to 4 and measuring the amount of power generation therefor. The amount of power generation was measured in a state in which a lower side of the thermoelectric conversion element is brought into contact with the heat source SH at a temperature of 30° C., an upper side of the thermoelectric conversion element is brought into contact with the cold source CS at a temperature of 20° C., and a temperature difference between the upper side and the lower side of the thermoelectric conversion element is maintained at 10° C. A heater whose temperature was controlled at 30° C. was used as the heat source HS. Further, a cooling plate whose temperature was controlled at 20° C. was used as the cold source CS. Further, a metal probe was brought into contact with the electrode to measure an output voltage when a constant current was supplied to the thermoelectric conversion element. Respective output voltages were measured when a current value of a current supplied to the thermoelectric conversion element is set to a plurality of types of magnitude, and a maximum value of power corresponding to a product of a current supplied to the thermoelectric conversion element and an output voltage was set to the amount of power generation of the thermoelectric conversion element. Then, the amounts of power generation of the 20 thermoelectric conversion elements according to each of Examples 1 to 4 and Comparative Examples 1 to 4 were measured, and an average value of the amounts of power generation was calculated. In addition, the crack generation rate after the firing process was evaluated by preparing 100 thermoelectric conversion elements according to each of Examples 1 to 4 and Comparative Examples 1 to 4 and visually verifying the presence or absence of a crack. Table 1 shows results of evaluation of the power generation efficiency and evaluation of the crack generation rate after the firing process.

TABLE 1

|  | W1 [μm] | W2 [μm] | W2/W1 | Amount of power generation [μW] | Power generation efficiency [μW/mm$^2$] | Crack generation rate [%] |
| --- | --- | --- | --- | --- | --- | --- |
| Comparative Example 1 | 10 | 30 | 3 | 21 | 2.4 | 43 |
| Comparative Example 2 | 10 | 40 | 4 | 37 | 3.5 | 36 |
| Example 1 | 10 | 50 | 5 | 55 | 4.4 | 9 |
| Example 2 | 10 | 70 | 7 | 74 | 4.6 | 3 |
| Example 3 | 10 | 90 | 9 | 88 | 4.5 | 1 |
| Example 4 | 10 | 110 | 11 | 99 | 4.2 | 0 |
| Comparative Example 3 | 10 | 130 | 13 | 105 | 3.9 | 0 |
| Comparative Example 4 | 10 | 150 | 15 | 110 | 3.6 | 0 |

As shown in Table 1 and FIG. 8, it was found that when a thickness ratio W2/W1 corresponding to a ratio of the thickness W2 of the first thermoelectric conversion portion 13 to the thickness W1 of the second thermoelectric conversion portion 11 in the Y-axis direction is in a range of 5 to 11, the power generation efficiency is 4 μW/mm$^2$ or more. From this evaluation result, it is considered that when the thickness ratio W2/W1 is in the range of 5 to 11, a resistance value of the first thermoelectric conversion portion 13 and a resistance value of the second thermoelectric conversion portion 11 approach the same value, and the power generation efficiency of the thermoelectric conversion element is improved accordingly.

Further, as shown in Table 1, it was found that the crack generation rate after the firing process is 36% or more when the thickness ratio W2/W1 is 4 or less, whereas the crack generation rate is reduced to 9% or less when the thickness ratio W2/W1 is 5 or more. Here, the presence or absence of change in power generation efficiency before and after exposure to corrosive gas was evaluated with regard to the thermoelectric conversion elements according to Examples 1 to 4 and the thermoelectric conversion elements according to Comparative Examples 1 to 4. The exposure to the corrosive gas was performed by leaving the thermoelectric conversion elements for 240 hours in a test chamber in which the corrosive gas was dispersed. The inside of the test chamber was maintained in an atmosphere having H$_2$S concentration of 3 ppm, SO$_2$ concentration of 10 ppm, a temperature of 40° C., and humidity of 85%. The conditions for this gas corrosion test are conditions that assume general outdoor use (excluding use in an area having a large environmental load such as a hot spring area) as defined by the technical standard DN8J112A. In the case of the thermoelectric conversion elements according to Comparative Examples 1 and 2, those having cracks after the firing process generate no power even when those are brought into contact with the heat source HS and cold source CS after exposure to the corrosive gas. On the other hand, when the thermoelectric conversion elements according to Examples 1 to 4 and Comparative Examples 3 and 4 were brought into contact with the heat source HS and the cold source CS after exposure to the corrosive gas, all the thermoelectric conversion elements generated power at substantially the same level of power generation efficiency as that before exposure to the corrosive gas. From this fact, it is understood that it is important to reduce the crack generation rate after the firing process in maintaining corrosion-resistant gas performance of the thermoelectric conversion element. Therefore, to increase the yield of thermoelectric conversion elements to 90% or more, it is preferable to set the thickness ratio W2/W1 to 5 or more.

The electrical characteristic of the electrode was evaluated by measuring resistance values of the thermoelectric conversion elements according to Examples 5 to 8 using a digital multimeter. In addition, the adhesion strength of the electrode was evaluated by connecting a lead wire to the electrode of each of the thermoelectric conversion element according to Example 5 and the thermoelectric conversion elements according to Comparative Examples 5 to 7, then pulling the lead wire in a direction away from the laminated body, and then measuring the tensile strength when the electrode peels off. Twenty thermoelectric conversion elements according to each of Examples 5 to 8 were prepared, and average values of the resistance values and the tensile strengths were calculated. Table 2 shows evaluation results of the average value of the resistance values and the average value of the tensile strengths of the thermoelectric conversion elements.

TABLE 2

|  | Electrode material | Element resistance [Ω] | Tensile strength [MPa] |
| --- | --- | --- | --- |
| Example 5 | Ag | 98 | 0.8 |
| Example 6 | Ni | 5.2 | 0.2 |
| Example 7 | NiMo | 6.0 | 1.0 |
| Example 8 | NiCr | 5.4 | 3.2 |

As shown in Table 2, it was found that in the case of Example 5, that is, in a case where an electrode material corresponding to a material that forms the electrode is Ag, the resistance value is relatively high at 98Ω, and an electrical bonding state between the electrode and the first thermoelectric conversion portion 13 is poor. On the other hand, it was found that in the case of Examples 6 to 8, that is, in a case where the electrode material is Ni, NiMo, or NiCr, the resistance value is relatively low at 5.2Ω to 6.0Ω, and the electrical bonding state between the electrode and the first thermoelectric conversion portion 13 is satisfactory. However, it was found that in the case of Examples 6 and 7, that is, in a case where the electrode material is Ni or NiMo, the tensile strength is relatively low at 1.0 MPa or less, and the electrode easily peels off. On the other hand, it was found that in the case of Example 8, that is, in a case where the electrode material is NiCr, the tensile strength is as high at 3.2 MPa, and the electrode hardly peels off. A reason therefor is considered as follows. When the electrode is formed using NiCr, Cr contained in the electrode is oxidized and firmly bonded to the composite oxide contained in the first thermoelectric conversion portion 13 exposed on the surface of the first thermoelectric conversion portion 13, so that the peel strength of the electrode increases. In addition, the electrodes of the thermoelectric conversion elements according to Examples 5 and 8 had more satisfactory solder wettability than that of the electrodes of the thermoelectric conversion elements according to Examples 6 and 7. Therefore, it is considered that the electrode of the thermoelectric conversion element according to Example 8 is more advantageous than the electrodes of the thermoelectric conversion elements according to Examples 5 to 7 from the viewpoint of improving peel strength when a metal layer is further formed on the electrode surface. From these evaluation results, it is preferable that at least a part of the electrode in contact with the first thermoelectric conversion portion 13 is formed using NiCr from the viewpoint of improving the peel strength of the electrode.

In the thermoelectric conversion element 10 according to the present embodiment, a thermal expansion coefficient of the second thermoelectric conversion portion 11 is larger than a thermal expansion coefficient of the first thermoelectric conversion portion 13. A reason therefor is that the first thermoelectric conversion portion 13 is formed using a complex oxide, whereas the second thermoelectric conversion portion 11 contains 80 wt. % of a NiMo alloy having a higher thermal expansion coefficient than that of the complex oxide. In contrast, in the thermoelectric conversion element 10 according to the present embodiment, the ratio W2/W1 of the thickness W2 of the first thermoelectric conversion portion 13 to the thickness W1 of the second thermoelectric conversion portion 11 in the Y-axis direction is greater than 4. In this way, the stress applied to the first thermoelectric conversion portion 13 and the second thermoelectric conversion portion 11 immediately after the firing process of the thermoelectric conversion element 10 is alleviated. Therefore, generation of cracks in the first thermoelectric conversion portion 13 and the second thermoelectric conversion portion 11 immediately after the firing process is reduced. Further, according to the thermoelectric conversion element 10 according to the present embodiment, the thickness ratio W2/W1 in the Y-axis direction is greater than 4 and 11 or less. In this way, the resistance value of the first thermoelectric conversion portion 13 can approach the resistance value of the second thermoelectric conversion portion 11, and thus the power generation efficiency of the thermoelectric conversion element 10 is improved accordingly.

Further, according to the thermoelectric conversion element 10 according to the present embodiment, as illustrated in FIG. 1 and FIG. 2, the end portions of the second thermoelectric conversion portion 11 in the ±X direction and ±Z direction are covered with the first insulator portion 15b that is chemically stable against the corrosive gas, and the second thermoelectric conversion portion 11 is not exposed on the outer surface of the thermoelectric conversion element 10. In this way, the material forming the second thermoelectric conversion portion 11 is prevented from chemically reacting with the corrosive gas present around the thermoelectric conversion element 10 to form impurities in the second thermoelectric conversion portion 11. Therefore, deterioration of the electrical characteristic of the thermoelectric conversion element 10 due to the corrosive gas present around the thermoelectric conversion element 10 is suppressed.

Incidentally, in the thermoelectric conversion element having the configuration in which the first thermoelectric conversion portions and the second thermoelectric conversion portions are alternately arranged with the insulator layers interposed therebetween as described above, there is a considered configuration including an insulator layer which is chemically stable against the corrosive gas and covers the whole thermoelectric conversion element. According to this configuration, the insulator layer prevents the corrosive gas present around the thermoelectric conversion element from coming into contact with the second thermoelectric conversion portion. However, in the case of this configuration, in a manufacturing method thereof, a process of forming the insulator layer that covers the entire thermoelectric conversion element is required, and the number of processes increases. On the other hand, in the method of manufacturing the thermoelectric conversion element 10 according to the present embodiment, since the insulator layer that covers the entire thermoelectric conversion element 10 is not provided, a process of forming the insulator layer that covers the entire thermoelectric conversion element 10 is unnecessary. In this way, it is possible to simplify the manufacturing method by reducing the number of processes.

Incidentally, the thermoelectric conversion element is generally used in an environment susceptible to thermal shock. Further, when the thermoelectric conversion element receives the thermal shock, for example, thermal stress is generated in an electrode connected to the power management circuit or the wireless communication circuit. Further, in a case where the peel strength of the electrode is low, when the thermal shock is repeatedly applied to the thermoelectric conversion element and the thermal stress is repeatedly generated in the electrode, there is concern that the electrode may peel off. On the other hand, in the electrode 16 according to the present embodiment, the part in contact with the first main surface 100a or the second main surface 100b of the laminated body 100, that is, the ground layer 161 is formed using NiCr. As a result, Cr contained in the ground layer 161 is oxidized and firmly bonded to the composite oxide contained in the first thermoelectric conversion portion 13 exposed on the first main surface 100a or the second main surface 100b. Therefore, for example, the peel strength of the electrode 16 can be increased as compared to a case where the electrode 16 is formed only using Ag or Ni. In addition, since both the ground layer 161 and the intermediate layer 162 are alloys, the thermal conductivity of the electrode 16 becomes lower as compared to a case where the electrode 16 is formed only using Ag or Ni, for example. Accordingly, heat transfer from the lower side of the thermoelectric conversion element 10 in contact with the heat source HS to the upper side thereof in contact with the cold source CS is suppressed, and accordingly, the temperature difference between the upper side and the lower side of the thermoelectric conversion element 10 can be increased, which is advantageous in that the power generation efficiency increases.

Further, the electrode 16 according to the present embodiment is disposed inside the projection area A1 of the second thermoelectric conversion portion 11 in the Y-axis direction on the first main surface 100a and the second main surface 100b of the laminated body 100. Further, the gaps G1 and G2 are formed between the electrode 16 and each of the heat source HS and the cold source CS. As a result, heat transfer between the electrode 16 and the heat source HS or the cold source CS is suppressed, and heat dissipation at parts corresponding to the gaps G1 and G2 of the first thermoelectric conversion portion 13 is enhanced. Therefore, the temperature difference between the lower side of the thermoelectric conversion element 10 in contact with the heat source HS and the upper side thereof in contact with the cold source CS increases, and thus the power generation efficiency is increased accordingly.

In addition, the thickness W3 of the part of the ground layer 161 according to the present embodiment having the smallest thickness in the Y-axis direction is 1 µm or less. As a result, the heat transfer the part of the ground layer 161 having the smallest thickness in the Y-axis direction becomes low. Accordingly, heat transfer from the lower side of the thermoelectric conversion element 10 in contact with the heat source HS to the upper side thereof in contact with the cold source CS is suppressed, and accordingly, the temperature difference between the upper side and the lower side of the thermoelectric conversion element 10 can be increased, which is advantageous in that the power generation efficiency increases.

Incidentally, a method of applying a metal paste as a base of the electrode 16 to an individual piece of the laminated body and firing the individual piece of the laminated body is conceivable as the method of manufacturing the thermoelectric conversion element 10. However, in the case of this method, thermal stress is generated at a bonding part between the piece of the laminated body and the metal paste, and there is concern that cracks may occur after firing the piece of the laminated body. In contrast, in the method of manufacturing thermoelectric conversion element 10 according to the present embodiment, the electrode 16 is formed after a process of firing the individual piece of the laminated body. As a result, it is possible to avoid the occurrence of cracks in the individual piece of the laminated body due to the thermal stress generated at the bonding part between the individual piece of the laminated body and the metal paste corresponding to the base of the electrode 16, and thus it is possible to improve the yield at the time of manufacturing the thermoelectric conversion element 10.

In addition, the electrode 16 according to the present embodiment is formed using a sputtering method. In this way, for example, the thickness of the electrode 16 can be reduced as compared to a case where the electrode 16 is formed by firing paste containing metal. Therefore, since the stress applied from the electrode 16 to the first thermoelectric conversion portion 13 is relieved, the occurrence of cracks in the first thermoelectric conversion portion 13, the second thermoelectric conversion portion 11, etc. starting from the electrode 16 is suppressed.

Furthermore, the first insulator portion 15b according to the present embodiment is formed using an oxide insulator material containing $Y_2O_3$—$ZrO_2$ that is chemically stable against a corrosive gas such as hydrogen sulfide. In addition the first thermoelectric conversion portion 13 is formed using an N-type semiconductor containing a complex oxide that is chemically stable to the corrosive gas. In this way, even when the thermoelectric conversion element 10 is used in an atmosphere in which hydrogen sulfide is dispersed, formation of sulfide in the second thermoelectric conversion portion 11 is prevented.

Figure 9:
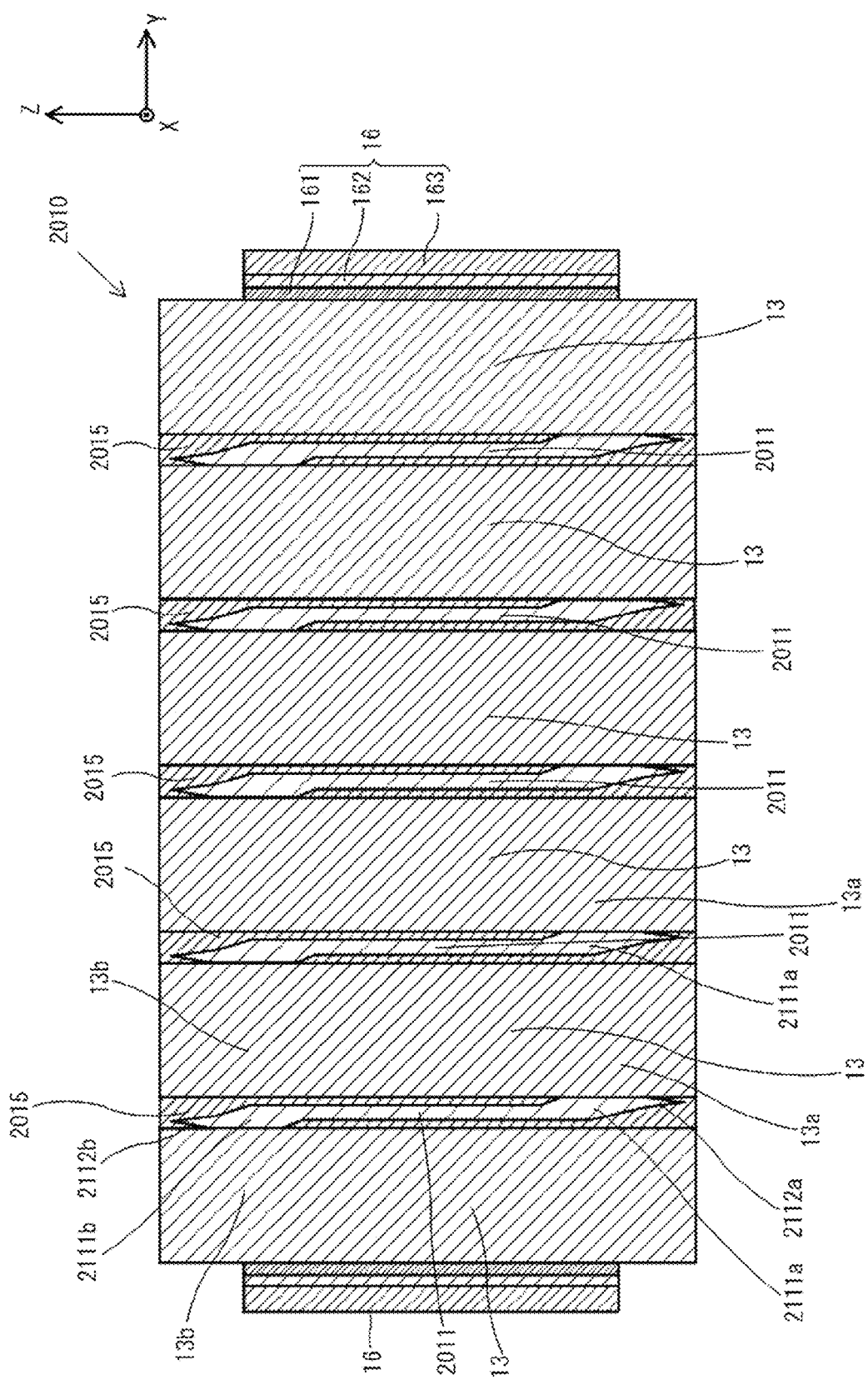
FIG. 9 is a cross-sectional view of a thermoelectric conversion element according to a modification.

Even though the embodiment of the present invention has been described above, the invention is not limited to the configuration of the embodiment described above. For example, as in a thermoelectric conversion element 2010 illustrated in FIG. 9, an end portion of the second thermoelectric conversion portion 2011 may not be flat. Note that in FIG. 9, the same components as those in the embodiment are denoted by the same reference numerals as those of FIG. 2. Here, the second thermoelectric conversion portion 2011 includes bonding portions 2111a and 2111b bonded to the first thermoelectric conversion portion 13, and protrusions 2112a and 2112b. The bonding portion 2111a on the lower side of the second thermoelectric conversion portion 2011 is electrically connected to a lower end portion 13a of a first thermoelectric conversion portion 13 adjacent thereto in a +Y direction. In addition, the bonding portion 2111b on the upper side of the second thermoelectric conversion portion 2011 is electrically connected to an upper end portion 13b of a first thermoelectric conversion portion 13 adjacent thereto in a −Y direction. The protrusions 2112a and 2112b protrude from the bonding portions 2111a and 2111b in a direction away from a central portion of the second thermoelectric conversion portion 2011 in the Z-axis direction, that is, in a direction approaching an end surface of the insulator layer 2015. Further, tip portions of the protrusions 2112a and 2112b are not in contact with the first thermoelectric conversion portion 13 adjacent thereto in the Y-axis direction.

In the embodiment, the example in which the insulator layer 15 is formed using $Y_2O_3$—$ZrO_2$ has been described. However, the oxide insulator material forming the insulator layer 15 is not limited thereto. For example, the insulator layer 15 may formed using $Y_2O_3$—$ZrO_2$ to which Mn is added.

In a method of manufacturing the thermoelectric conversion element according to the present modification, an insulating paste is produced as follows. The insulating paste is produced by mixing a powder material of $Y_2O_3$—$ZrO_2$, a powder material of $Mn_3O_4$, and an organic solvent such as varnish using a roll machine etc. Here, the powder material of $Mn_3O_4$ corresponds to 0.2 wt % when the powder material of $Y_2O_3$—$ZrO_2$ corresponds to 100 wt %. In this way, the thermoelectric conversion element in which Mn is contained in the insulator layer is manufactured. Note that the amount of the powder material of $Mn_3O_4$ may be appropriately selected according to the power generation performance required for the thermoelectric conversion element, and conditions necessary for co-sintering of the N-type oxide semiconductor material sheet, the P-type semiconductor material paste and the insulator paste. Further, the powder material is not limited to $Mn_3O_4$ as long as Mn can be added to the insulating paste. For example, the powder material may be a compound containing Mn such as $MnO_2$ or $MnCO_3$.

Here, a description will be given of results of evaluating power generation efficiency and a crack generation rate after a firing process with respect to the thermoelectric conversion element according to the present modification. The power generation efficiency and the crack generation rate after the firing process were evaluated using thermoelectric conversion elements according to Examples 9 to 11 having similar structures to a structure of the thermoelectric conversion element according to the present modification and thermoelectric conversion elements according to Comparative Examples 5 and 6. The lengths in the X-axis direction and the Z-axis direction, the number of layers of the second thermoelectric conversion portions 2011, the number of layers of the first thermoelectric conversion portions 13, the thickness W1 of the second thermoelectric conversion portion 2011, and the thickness of the second insulator portion 15a of each of the thermoelectric conversion elements according to Examples 9 to 11 were set to be the same as those of the thermoelectric conversion elements according to Examples 1 to 4 described above. Further, the thickness W2 of the first thermoelectric conversion portion 13 was set to 50 μm to 110 μm. In addition, the lengths in the X-axis direction and the Z-axis direction, the number of layers of the second thermoelectric conversion portions 2011, the number of layers of the first thermoelectric conversion portions 13, the thickness W1 of the second thermoelectric conversion portion 2011, and the thickness of the second insulator portion 15a of each of the thermoelectric conversion elements according to Comparative Examples 5 and 6 were set to be the same as those of the thermoelectric conversion elements according to Examples 1 to 4 described above. Further, the thickness W2 of the first thermoelectric conversion portion 13 was set to 30 μm, and 130 μm.

A method of evaluating the power generation efficiency and the crack generation rate after the firing process is similar to the method of evaluating the power generation efficiency and the crack generation rate after the firing process according to the embodiment described above. Table 3 shows results of evaluation of the power generation efficiency and evaluation of the crack generation rate after the firing process.

TABLE 3

|  | W1 [μm] | W2 [μm] | W2/W1 | Amount of power generation [μW] | Power generation efficiency [μW/mm$^2$] | Crack generation rate [%] |
| --- | --- | --- | --- | --- | --- | --- |
| Comparative Example 5 | 10 | 30 | 3 | 21 | 2.4 | 36 |
| Example 9 | 10 | 50 | 5 | 61 | 4.8 | 6 |
| Example 10 | 10 | 70 | 7 | 79 | 4.9 | 2 |
| Example 11 | 10 | 110 | 11 | 102 | 4.3 | 0 |
| Comparative Example 6 | 10 | 130 | 13 | 106 | 3.9 | 0 |

As shown in Table 3, the power generation efficiency of the thermoelectric conversion elements according to Examples 9 to 11 increased as compared to the power generation efficiency of the thermoelectric conversion elements according to Examples 1 to 4 described above. A reason therefor is considered as follows. By adding Mn to the insulator layer 15, the sintering behavior of the insulator layer 15 approaches the sintering behavior of the first thermoelectric conversion portion 13 and the second thermoelectric conversion portion 2011, and a hollow on the end surface of the insulator layer 15 is reduced. When the hollow on the end surface of the insulator layer 15 is reduced, the gap between the insulator layer 15, and the heat source HS and the cold source CS is reduced accordingly. In this case, since the efficiency of heat transfer through the insulator layer 15 between the second thermoelectric conversion portion 2011 and the heat source HS or the cold source CS increases, it is considered that the power generation efficiency of the thermoelectric conversion element increases. Further, the crack generation rate after the firing process of the thermoelectric conversion elements according to Examples 9 to 11 is reduced as compared to the crack generation rate after the firing process of the thermoelectric conversion elements according to Examples 1 to 4 described above. A reason therefor is considered as follows. When the sintering behavior of the insulator layer 15 is close to that of the first thermoelectric conversion portion 13 and the second thermoelectric conversion portion 2011, the stress generated immediately after the firing process is relaxed.

According to this configuration, the power generation efficiency of the thermoelectric conversion element can be improved while reducing the crack generation rate after the firing process.

Figure 10:
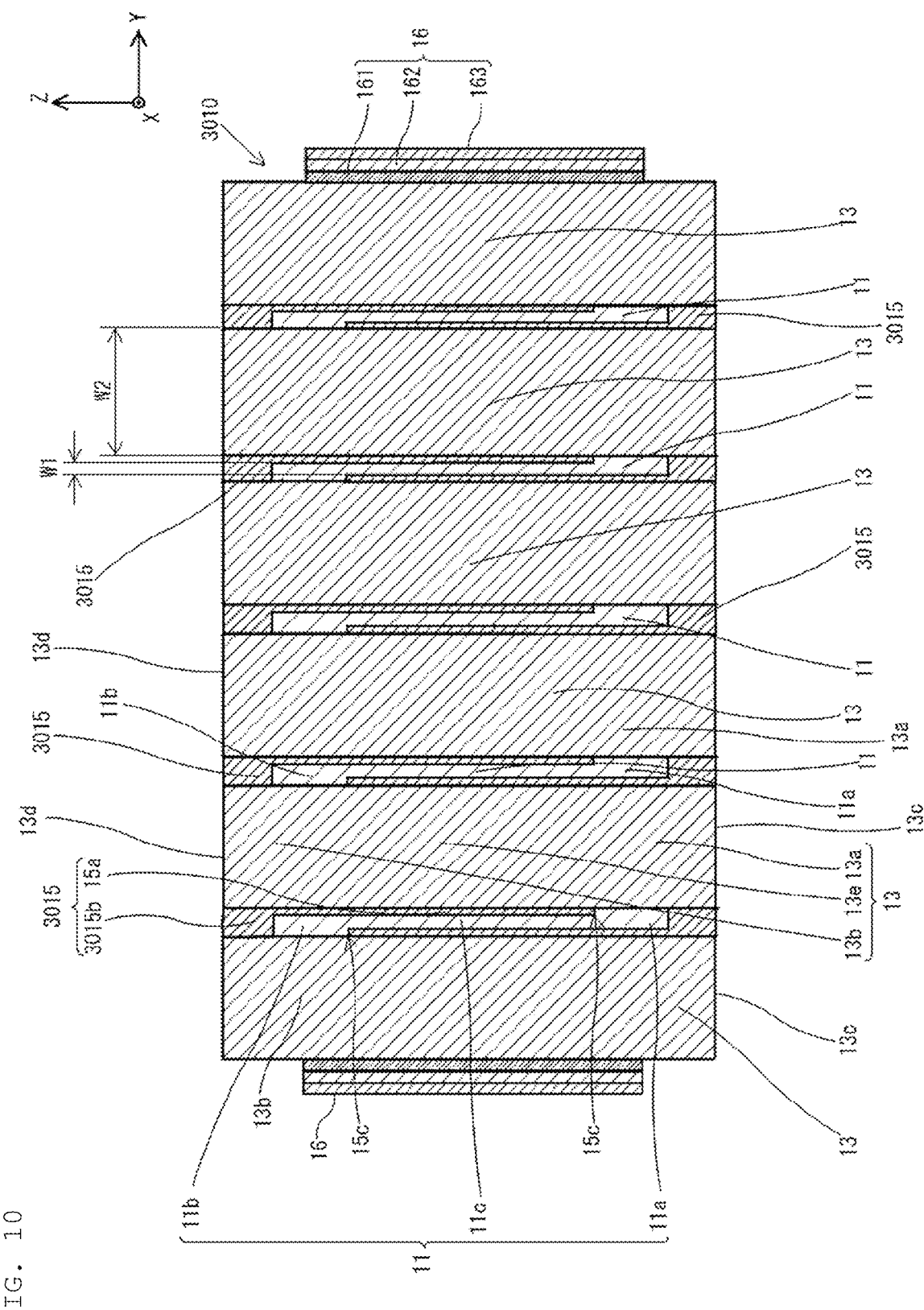
FIG. 10 is a cross-sectional view of a thermoelectric conversion element according to a modification.

In the embodiment, a description has been given of the thermoelectric conversion element 10 in which the concave portion 15d recessed toward the center of the laminated body in the X-axis direction and the Z-axis direction from the end surface 13d in the X-axis direction and the Z-axis direction in the first thermoelectric conversion portion 13 is formed on the end surface of the insulator layer 15. However, the insulator layer is not limited to the one having the concave portion formed on the end surface. For example, as illustrated in in FIG. 10, it is possible to adopt a heat conversion element 3010 in which a concave portion is not formed on a first insulator portion 3015b of an insulator layer 3015 and an end surface of the insulator layer 3015 is flat. Note that in FIG. 10, the same components as those in the first embodiment are denoted by the same reference numerals as those of FIG. 2. Such a thermoelectric conversion element 3010 in which the end surface of the insulator layer 3015 is flat is realized by, for example, adding Mn to the insulating paste corresponding to the base of the insulator layer 3015 or appropriately setting manufacturing conditions related to formation of other insulator layers 3015 in a manufacturing process thereof.

Figure 11:
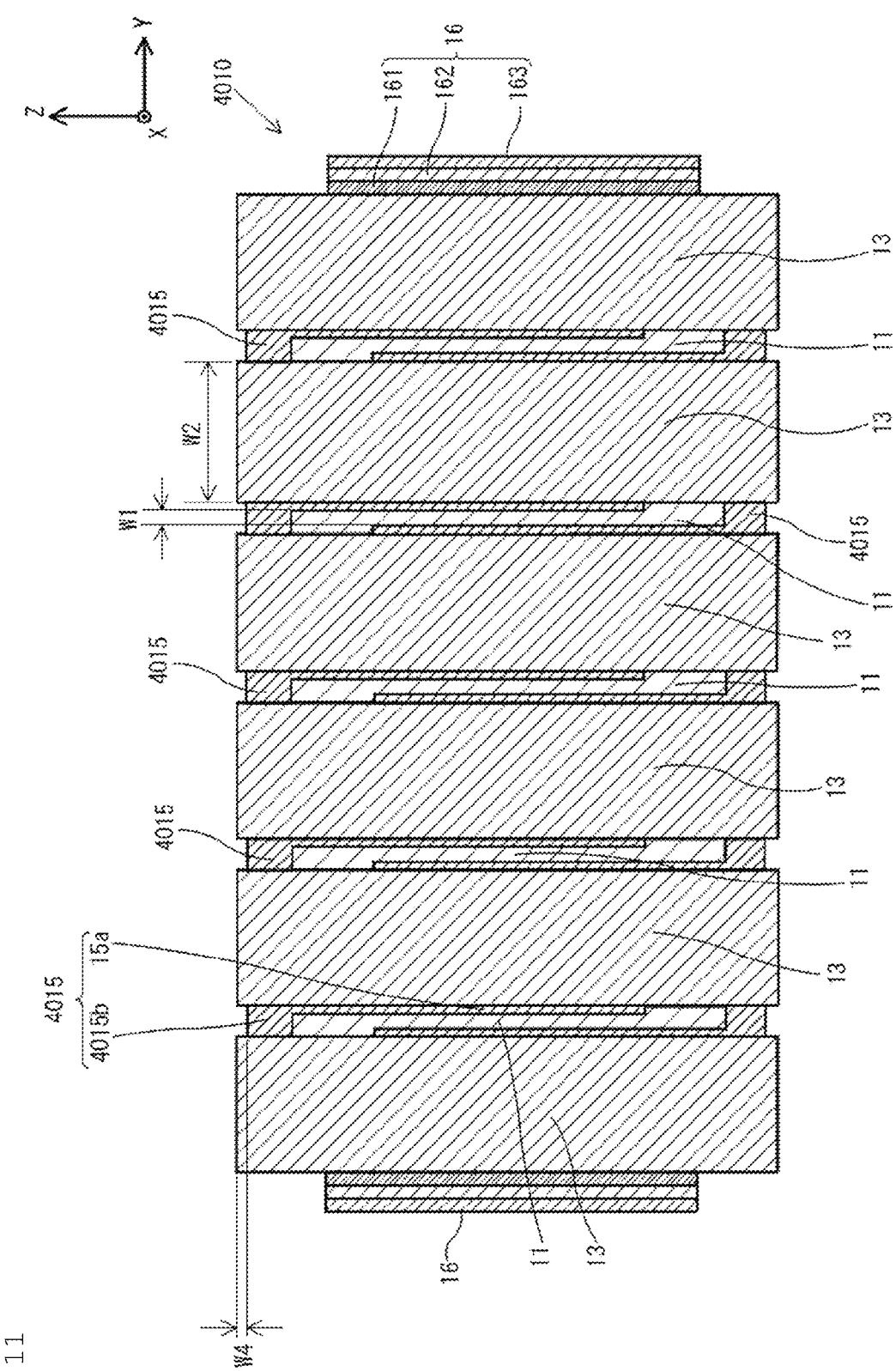
FIG. 11 is a cross-sectional view of a thermoelectric conversion element according to a modification.

In the embodiment, an example in which the first insulator portion 15b covers the entire side surface (surface in the Y-axis direction) of the first thermoelectric conversion portion 13 has been described. However, the invention is not limited thereto. For example, as illustrated in FIG. 11, it is possible to adopt a thermoelectric conversion element 4010 in which a first insulator portion 4015b of an insulator layer 4015 does not cover a part of a side surface of the first thermoelectric conversion portion 13. That is, it is possible to adopt the thermoelectric conversion element 4010 in which the side surface of the first thermoelectric conversion portion 13 is exposed. Note that in FIG. 11, the same components as those in the first embodiment are denoted by the same reference numerals as those of FIG. 2. For example, a width W4 between the end surface of the first thermoelectric conversion portion 13 in the Z-axis direction and the end surface of the first insulator portion 4015b in the Z-axis direction can be set to about 10 μm.

According to this configuration, for example, when the heat source HS and the cold source CS are formed using an elastic material, the contact area of the first thermoelectric conversion portion 13 with the heat source HS and the cold source CS can be increased by the amount of the end portion in the ±Z direction that is exposed without being covered with the first insulator portion 4015b. As a result, the heat transfer efficiency between the thermoelectric conversion element 4010, and the heat source HS and the cold source CS is increased, and thus a temperature difference between both end portions of the thermoelectric conversion element 4010 in the Z-axis direction can be made close to a temperature difference between the heat source HS and the cold source CS.

In the embodiment, an example in which the electrode 16 is formed using the sputtering method has been described. However, a method of forming the electrode 16 is not limited thereto. For example, the electrode 16 may be formed by other vapor phase growth methods such as a vacuum deposition method, an ion plating method, a pulsed laser deposition (PLD) method, a chemical vapor deposition (CVD) method, etc. Alternatively, the electrode 16 may be formed by a liquid phase growth method such as an electrolytic plating method, an electroless plating method, a sol-gel method, etc.

According to this configuration, for example, the thickness of the electrode 16 can be reduced as compared to a case where the electrode 16 is formed by firing paste containing metal. Therefore, since the stress applied from the electrode 16 to the first thermoelectric conversion portion 13 is relieved, the occurrence of cracks in the first thermoelectric conversion portion 13, the second thermoelectric conversion portion 11, etc. starting from the electrode 16 is suppressed.

In the method of manufacturing the thermoelectric conversion element 10 of the embodiment, a description has been given of an example in which the thickness of the N-type oxide semiconductor material sheet is set to 40 μm to 110 μm, the thickness of the P-type semiconductor material paste layer is set to 10 μm, and the number of laminated N-type oxide semiconductor material sheets is set to 35. However, the thickness of the N-type oxide semiconductor material sheet, the thickness of the P-type semiconductor material paste layer, the thickness of the insulator paste layer, and the number of laminated N-type oxide semiconductor material sheets are not limited thereto. These figures may be appropriately changed according to an output voltage and an output current required for the thermoelectric conversion element 10, a resistance value of a load connected to the thermoelectric conversion element 10, etc.

In the embodiment, a description has been given of an example in which the electrode 16 has a three-layer structure including the ground layer 161 formed using NiCr, the intermediate layer 162 formed using NiCu, and the contact layer 163 formed using Ag. However, the structure of the electrode 16 is not limited thereto. For example, the electrode 16 may have a two-layer structure in which a contact layer formed using Au or Pt is provided on a ground layer formed using NiCr. Alternatively, the electrode 16 may be formed only using NiCr. According to this configuration, for example, when the electrode is formed using the sputtering method, the frequency of switching a material source can be reduced, so that a time required for forming the electrode can be shortened.

In the method of manufacturing the thermoelectric conversion element 10 of the embodiment, a description has been given of an example of using an oxide ($La_2O_3$ and $TiO_2$) and carbonate ($SrCO_3$) to produce the N-type oxide semiconductor material sheet and the P-type semiconductor material paste. However, the invention is not limited thereto, and other compounds may be used as long as the oxide thermoelectric conversion material can be formed by firing. Further, in the method of manufacturing the thermoelectric conversion element 10 according to the embodiment, a description has been given of an example in which Ni and Mo are used as a metal raw material of the P-type semiconductor material paste. However, the invention is not limited thereto, and chromium (Cr) or tungsten (W) may be used instead of Mo.

In the method of manufacturing the thermoelectric conversion element 10 according to the embodiment, a description has been given of an example in which a powder material of $Y_2O_3$—$ZrO_2$ (yttria stabilized zirconia) is used to produce the insulator paste. In addition, in the modification, a description has been given of an example in which a powder material of $Y_2O_3$—$ZrO_2$ to which Mn is added is used. However, the invention is not limited thereto, and it is possible to sinter the N-type oxide semiconductor material and the P-type semiconductor material together. When an insulator layer is formed by firing insulator paste in a reducing atmosphere, other types of oxides may be used as long as the insulator layer has electrical insulation. Further, the stabilizer is not limited to $Y_2O_3$, and may be another stabilizer (for example, CaO, MgO, etc.). However, it is preferable to use $Y_2O_3$ or CaO as the stabilizer owing to the materials used for the N-type oxide semiconductor material sheet and the P-type semiconductor material paste and the thermal expansion coefficients thereof.

Even though the embodiment and the modification of the invention (including those described in an explanatory note, which is similarly applied to the following description) have been described above, the invention is not limited thereto. The invention includes those obtained by combining the embodiment and modification as appropriate, and those obtained by modifying the embodiment and modification as appropriate.

This application is based on Japanese Patent Application No. 2017-191681 filed on Sep. 29, 2017. In this specification, the entire specification, claims, and drawings of Japanese Patent Application No. 2017-191681 are incorporated by reference.

DESCRIPTION OF REFERENCE SYMBOLS 10, 2010, 3010, 4010: THERMOELECTRIC CONVERSION ELEMENT
11, 2011 SECOND THERMOELECTRIC CONVERSION PORTION
11a: LOWER PORTION
11b: UPPER PORTION
11c, 13e: CENTRAL PORTION
13: FIRST THERMOELECTRIC CONVERSION PORTION
13a: LOWER END PORTION
13b: UPPER END PORTION
13c, 13d: END SURFACE
15, 2015, 3015, 4015: INSULATOR LAYER
15a: SECOND INSULATOR PORTION
15b, 3015b, 4015b: FIRST INSULATOR PORTION
15c: BONDING PORTION
15d: CONCAVE PORTION
115a: FIRST SLIT
117a: SECOND SLIT
16: ELECTRODE
100: LAMINATED BODY
100a: FIRST MAIN SURFACE
100b: SECOND MAIN SURFACE
111: N-TYPE OXIDE SEMICONDUCTOR MATERIAL SHEET
113: P-TYPE SEMICONDUCTOR MATERIAL PASTE LAYER
115: FIRST INSULATOR PASTE LAYER
116: SECOND INSULATOR PASTE LAYER
117: THIRD INSULATOR PASTE LAYER
161: GROUND LAYER
162: INTERMEDIATE LAYER
163: CONTACT LAYER
2111a, 2111b: BONDING PORTION
2112a, 2112b: PROTRUSION
A1: PROJECTION AREA
CS: COLD SOURCE
G1, G2: GAP
HS: HEAT SOURCE
M: METAL MASK

The invention claimed is:

1. A thermoelectric conversion element comprising:
a laminated body including:
a plurality of first thermoelectric conversion portions;
a plurality of second thermoelectric conversion portions alternately arranged in an arrangement direction with the plurality of first thermoelectric conversion portions such that the plurality of first thermoelectric conversion portions and the plurality of second thermoelectric conversion portions are directly bonded to each other in first regions of bonded surfaces between the plurality of first thermoelectric conversion portions and the plurality of second thermoelectric conversion portions; and
an insulator layer interposed between the plurality of first thermoelectric conversion portions and the plurality of second thermoelectric conversion portions in second regions of the bonded surfaces so as to surround a periphery of each of the plurality of second thermoelectric conversion portions,
the laminated body having a first main surface and a second main surface located at opposed ends thereof in the arrangement direction and end surfaces located at opposed ends in a direction perpendicular to the arrangement direction, and
a ratio of a first thickness of each of the plurality of first thermoelectric conversion portions to a second thickness of each of the plurality of second thermoelectric conversion portions in the arrangement direction is greater than 4 and 11 or less.

2. The thermoelectric conversion element according to claim 1, further comprising:
a first electrode on the first main surface of the laminated body; and
a second electrode on the second main surface of the laminated body.

3. The thermoelectric conversion element according to claim 2, wherein:
the first electrode includes a first NiCr layer in which at least a part thereof is in contact with the first main surface of the laminated body; and
the second electrode includes a second NiCr layer in which at least a part thereof is in contact with the second main surface of the laminated body.

4. The thermoelectric conversion element according to claim 2, wherein the first electrode is disposed inside a projection area of the plurality of second thermoelectric conversion portions in the arrangement direction on the first main surface, and the second electrode is disposed inside the projection area of the plurality of second thermoelectric conversion portions in the arrangement direction on the second main surface.

5. The thermoelectric conversion element according to claim 3, wherein a smallest thickness of a part of the first NiCr layer in the arrangement direction is 1 µm or less, and a smallest thickness of a part of the second NiCr layer in the arrangement direction is 1 µm or less.

6. The thermoelectric conversion element according to claim 5, wherein the first electrode includes a first metal film, and the second electrode includes a second metal film.

7. The thermoelectric conversion element according to claim 1,
wherein each of the plurality of first thermoelectric conversion portions comprises an oxide semiconductor,
each of the plurality of second thermoelectric conversion portions comprises a semiconductor containing a metal, and
the insulator layer comprises an oxide insulator.

8. The thermoelectric conversion element according to claim 7,
wherein the oxide semiconductor is an N-type semiconductor containing a complex oxide,
the semiconductor containing the metal is a P-type semiconductor containing Ni, Mo, and the composite oxide,
the oxide insulator contains $Y_2O_3ZrO_2$, and
the composite oxide contains Sr, La, and Ti.

9. The thermoelectric conversion element according to claim 8, wherein the oxide insulator further contains Mn.

10. The thermoelectric conversion element according to claim 1, wherein the first insulator layer has a concave portion recessed toward a center of the laminated body from the end surfaces of the laminated body.

11. The thermoelectric conversion element according to claim 1, wherein an end portion of the second thermoelectric conversion portion includes a protrusion that protrude away from a center of the laminated body.

12. The thermoelectric conversion element according to claim 11, wherein the protrusions are not in contact with the plurality of first thermoelectric conversion portions.

13. The thermoelectric conversion element according to claim 1, wherein the first insulator layer is recessed toward a center of the laminated body from the end surfaces of the laminated body.

* * * * *